United States Patent
Tanabe

(10) Patent No.: US 7,466,965 B2
(45) Date of Patent: Dec. 16, 2008

(54) TRANSMISSION METHOD AND TRANSMITTER CIRCUIT

(75) Inventor: Mitsuru Tanabe, Katano (JP)

(73) Assignee: Panasonic Corporation, Osaka (JP)

( * ) Notice: Subject to any disclaimer, the term of this patent is extended or adjusted under 35 U.S.C. 154(b) by 568 days.

(21) Appl. No.: 11/261,472

(22) Filed: Oct. 31, 2005

(65) Prior Publication Data

US 2006/0092326 A1   May 4, 2006

(30) Foreign Application Priority Data

Nov. 2, 2004   (JP) ............................. 2004-319550

(51) Int. Cl.
H04B 1/02 (2006.01)
(52) U.S. Cl. ................ 455/102; 455/126; 455/110; 375/300; 375/302
(58) Field of Classification Search ................ 455/126, 455/108, 110, 116, 127.1, 102, 127.2, 123, 455/522, 552.1, 424, 425, 456.5, 456.6, 550.1, 455/575.1, 138, 67.11, 67.16, 136, 147, 180.1, 455/139, 188.1, 304, 114.3, 127.4, 553.1; 375/300, 302, 303, 305, 271, 274, 298, 306, 375/307, 376, 296, 285, 295, 265, 283, 345, 375/219; 330/129, 282, 141, 281, 149, 136, 330/151; 370/205, 347, 344; 331/1 A, 10, 331/25

See application file for complete search history.

(56) References Cited

U.S. PATENT DOCUMENTS

| | | | | |
|---|---|---|---|---|
| 5,420,536 | A * | 5/1995 | Faulkner et al. ............. | 330/149 |
| 5,901,347 | A * | 5/1999 | Chambers et al. ......... | 455/234.1 |
| 6,256,482 | B1 * | 7/2001 | Raab .......................... | 455/108 |
| 6,366,177 | B1 | 4/2002 | McCune et al. | |
| 6,377,784 | B2 | 4/2002 | McCune | |
| 6,449,465 | B1 * | 9/2002 | Gailus et al. ................ | 455/126 |
| 6,528,975 | B2 * | 3/2003 | Sander ....................... | 323/281 |
| 6,834,084 | B2 * | 12/2004 | Hietala ....................... | 375/296 |
| 6,975,686 | B1 * | 12/2005 | Khatibzadeh et al. ....... | 375/295 |
| 6,998,914 | B2 * | 2/2006 | Robinson ................ | 330/124 R |
| 7,068,984 | B2 * | 6/2006 | Mathe et al. ................ | 455/126 |
| 7,193,470 | B2 * | 3/2007 | Lee et al. .................... | 330/285 |
| 7,359,680 | B2 * | 4/2008 | Klemmer .................... | 455/102 |
| 2002/0141510 | A1 * | 10/2002 | Sridharan et al. ........... | 375/300 |
| 2004/0198258 | A1 * | 10/2004 | Tanaka et al. ............... | 455/108 |
| 2004/0219891 | A1 * | 11/2004 | Hadjichristos ............. | 455/102 |
| 2005/0176388 | A1 * | 8/2005 | Yamawaki et al. .......... | 455/126 |
| 2006/0009169 | A1 * | 1/2006 | Arayashiki .................. | 455/108 |

(Continued)

Primary Examiner—Edward Urban
Assistant Examiner—Charles Chow
(74) Attorney, Agent, or Firm—Dickinson Wright, PLLC

(57) ABSTRACT

An amplitude component of a modulating signal is detected, band-divided by first and second frequency selecting circuits, and an amplitude component of a high-frequency band is down-converted by a first frequency conversion circuit. An amplitude component selected by the first frequency selecting circuit and an amplitude component selected by the first frequency conversion circuit are amplified by first and second operational amplifiers, and a signal amplified by the second operational amplifier is up-converted by a second frequency conversion circuit to be restored to the initial frequency band. Output amplitudes of the first operational amplifier and a second frequency converter are added up by an adder to be direct-current converted. The amplitudes after the direct-current conversion are band-divided by third and fourth frequency selecting circuits, respectively, feedback amounts thereof are adjusted, and then fed back to the first and second operational amplifiers.

12 Claims, 18 Drawing Sheets

U.S. PATENT DOCUMENTS

2006/0111057 A1* 5/2006 Akizuki et al. ............. 455/108
2006/0264186 A1* 11/2006 Akizuki et al. ............. 455/108
2007/0053463 A1* 3/2007 Hara .......................... 375/295
2007/0147541 A1* 6/2007 Saito .......................... 375/297
2007/0281652 A1* 12/2007 Tanaka et al. ............... 455/260

* cited by examiner

EXAMPLE OF TYPICAL LOW PASS FILTER

TRANSMISSION METHOD AND TRANSMITTER CIRCUIT

BACKGROUND OF THE INVENTION

1. Field of the Invention

The present invention relates to a transmission method and a transmitter circuit for transmitting a high-frequency signal by wireless.

2. Related Art

In a modulating signal involving frequency modulation, in general, especially multi-level modulation such as the quadrature amplitude modulation (QAM), it requires a linear operation for a high-frequency power amplifier disposed in a transmitter circuit for transmitting electricity for an antenna. An operation class A or AB has therefore been utilized for the high-frequency power amplifier.

However, broadbandization of communication has initiated the use of a communication method by a multicarrier such as the Orthogonal Frequency Division Multiplex (OFDM), thereby leading the conventional class A or class AB high-frequency power amplifier not to capable of achieving high-efficiency. In other words, in the OFDM modulation, superposing of sub-carriers generates momentarily a large amount of power completely at random, thereby a ratio of average power to momentary peak power, i.e., a Peak to Average Power Ratio (PAPR), becomes larger. Thus, it is required to hold large direct-current (DC) power constantly for allowing the momentary peak power being amplified linearly. Since the DC power set as such is too large for amplifying the average power, the excess DC power is wasted as heat. It results in the power supply efficiency being substantially reduced.

Consequently, continuous usable time of, for example, a portable wireless application utilizing a battery as the power supply becomes shorter, causing a practical problem.

For the purpose of solving such problems, there is proposed a conventional Envelope Elimination and Restoration (EER) method, known as the Khan's method.

FIG. 18 is a block circuit diagram schematically illustrating the conventionally known EER method (see Patent Documents 1 and 2, for example). Firstly, functions of respective blocks will be described.

In this figure, in a modulating signal generated by a modulating signal generating circuit 1901, a phase component and an amplitude component thereof are separately detected by a detection circuit 1902. In particular, the modulating signal generated by the modulating signal generating circuit 1901 is a complex signal including, In-phase (in-phase signal) and Quadrature (orthogonal signal). This modulating signal is detected as the amplitude component $\sqrt{(I^2+Q^2)}$ and the phase component $\tan^{-1}(Q/I)$, separately. Since they are processed in the form of a digital signal, they are digital/analog converted by a digital/analog converter (D/A converter) for a subsequent process in an analog processing block. The D/A converter is included in the detection circuit 1902, for example. The D/A converter converts an input bit signal to an analog signal by means of, for example, an offset binary code. The offset binary code is one of conversion codes for handling positive and negative signals, wherein a maximum positive value is a maximum positive value of a dynamic range of a D/A converter output shifted by 1 LSB.

Hence, the phase component output from the detection circuit 1902 passes through the D/A converter to be output to an orthogonal modulator 1905 corresponding to a frequency conversion means. The orthogonal modulator 1905 multiplies an IQ signal from the D/A converter by a SIN-wave and a COS-wave, having an angular velocity of a carrier frequency ($\omega$), respectively, to up-convert the phase component. Subsequently, the phase component converted to a modulated wave is input into a high-frequency input terminal of a high-frequency power amplifier 1906 in the form of a high-frequency power.

Moreover, the amplitude component passes through the D/A converter to be input into an operational amplifier 1907, and, after being amplified, input into an emitter follower 1908 corresponding to a DC conversion means. Output amplitude of the emitter follower 1908 is determined by input amplitude of the operational amplifier 1907 and a feedback amount of the output amplitude fed back to a feedback terminal, i.e., an inverting terminal, of the operational amplifier 1907. The feedback amount is determined by, for example, a resistance value ratio of voltage dividing resistors R, r of a feedback circuit 1903 corresponding to a feedback means. That is, the feedback amount for the operational amplifier 1907 is determined by r/(r+R), wherein a gain thereof is converting 1+R/r when the feedback terminal of the operational amplifier 1907 as a non-inverting amplifier is connected to the feedback circuit 1903, as shown in FIG. 18.

Reasons for forming a feedback loop as shown in FIG. 18 are that the amplitude component (voltage) of the output from a DC converter 1908 is required to be the linearly-amplified output from the D/A converter, and that both linear and non-linear distortions in the output from the DC converter 1908 are required to be as minimum as possible. Here, the linear distortion in the output from the DC converter 1908 represents disturbance of a frequency response due to a group delay. The non-linear distortion represents disturbance of an amplitude response due to a non-linearity of conductance of an active element.

The feedback loop is therefore formed so as to feed back the output from the D/C converter 1908 to the feedback terminal of the operational amplifier 1907 to decrease an error between the input into the operational amplifier 1907 and the output to the DC converter 1908. The voltage output from the DC converter 1908 in this manner is input into a power supply (drain or collector terminal) of the high-frequency power amplifier 1906. Assuming that the high-frequency power amplifier 1906 is of a saturation type, the output voltage from the high-frequency power amplifier 1906 is proportional to the power source voltage. Hence, the phase component and the amplitude component are multiplied with each other at the output side of the high-frequency power amplifier 1906, thereby the signal expressed by the following formula is obtained.

$$\sqrt{I^2+Q^q}\exp j\left(\omega t+\tan^{-1}\frac{Q}{I}\right) \qquad \text{[Formula 1]}$$

Which is down-converted by a demodulator (carrier frequency: $\omega$), thereby the modulated wave up-converted linearly of the modulating signal expressed by the following formula can be obtained.

$$\sqrt{I^2+Q^q}\exp j\left(\tan^{-1}\frac{Q}{I}\right) \qquad \text{[Formula 2]}$$

Next, the conception regarding the power efficiency will be described.

Here, the modulating signal (number of sub-carriers 52, modulation bandwidth 16.25 MHz), used in the IEEE 802.11a standard, is discussed as an illustrative example of the OFDM modulating signal. The maximum momentary power of the OFDM signal can be obtained when the maximum amplitudes of all the 52 sub-carriers overlap. Where $A_k$ (standardized at the maximum value), $B_k$, and $\omega$ are the amplitude, the phase, and a carrier wave frequency, respectively, the power is proportional to the following formula:

$$\left\{\sum_{k=1}^{52} A_k \exp j(k\omega t + B_k)\right\}^2 \quad \text{[Formula 3]}$$

Assuming that all the sub-carriers take the maximum values, then $A_k=1$, the foregoing formula can be expressed as follows.

$$\left\{\sum_{k=1}^{52} \exp j(k\omega t + B_k)\right\}^2 \quad \text{[Formula 4]}$$

By expanding this formula, expressed is an addition of the sum of squares of the respective sub-carriers and a doubled sum of the product of the different sub-carriers. That is, the momentary peak power is obtained by adding up a sum of the power of the respective 52 sub-carriers and a doubled number of combinations to select 2 sub-carriers among the 52 sub-carriers as a contribution of the sum of the product of the different sub-carriers (since the amplitude equals to 1, the product equals to 1). The resulting expression is $52+2*_{52}C_2=52+52*51$.

As for the average power, the following formula is integrated by a cycle of a fundamental wave $1/312.5$ kHz.

$$\left\{\sum_{k=1}^{52} A_k \exp j(k\omega t + B_k)\right\}^2 \quad \text{[Formula 5]}$$

However, since all the sub-carriers are orthogonal, the contribution of a sum of the product of the different sub-carriers equals to 0. The average power is thus expressed by the following formula, which is the sum of the average power of the respective 52 sub-carriers. Here, the symbol "< >" represents a time average.

$$\sum_{k=1}^{52} \langle A_k \rangle^2 \quad \text{[Formula 6]}$$

Since a primary modulation (BPSK, QPSK, 16 QAM, 64 QAM) of the OFDM modulation is not filtered, an amplitude ripple caused by filtering as is seen in single-carrier modulation does not occur, and thus the PAPR of the primary modulation depends only on a data mapping method. In the IEEE 802.11a standard, the mapping is performed so that $<A_k>^2$ for all the sub-carriers equals to 1. Symbol points and their normalization coefficients are shown below.

BPSK: ±1
QPSK: (±1±j)/sqrt(2)
16 QAM: ([−3, −1, 1, 3]+[−3, −1, 1, 3]j)/sqrt(10)
64 QAM: ([−7, −5, −3, −1, 1, 3, 5, 7]+[−7, −5, −3, −1, 1, 3, 5, 7]j)/sqrt(42)

Since normalization coefficients 1/sqrt(2), 1/sqrt(10), and 1/sqrt(42) are fixed so that the power equals to 1 as described above, the PAPR of the primary modulation is 0 dB. Hence, the PAPR of the OFDM modulation equals to $$10*\log(52+52*51)/52=10*\log(52)=17 \text{ dB}$$

where, sqrt(x) represents a square root of the value x.

However, since it is very unlikely that all the sub-carriers take the maximum values simultaneously in the practical modulation, an output back off of the high-frequency power amplifier required for satisfying modulation accuracy stated in the IEEE 802.11a standard is approximately 7 dB. Here, the back off is a ratio of the output power obtained from the linear amplifier compressing a linear response by 1 dB (P1 dB) to the average output power.

That is, in the OFDM modulation, the high-frequency power amplifier operates using the power of 20% of P1 dB (=7 dB back off) as the average power. The remaining 80% is wasted without contributing to the power amplification. When considering the class A amplifier among the linear amplifiers as an example, the power efficiency in its saturated operation is 50%, while it operates with the power efficiency of 20% thereof, i.e., 10%, for processing the OFDM modulated wave. As described above, since the OFDM modulated wave has the large PAPR, the linear amplifier operates with the large back off, causing a problem of low efficiency in the high-frequency power amplifier.

Next, effects of using the EER method will be described.

The EER method, being one of means to solve the foregoing problems, separates the modulating signal represented by complex vectors as described above into the phase component and the amplitude component by converting to polar coordinates. The amplitude of the separated phase component is the constant modulating signal, so that the PAPR of the modulated wave is 0 dB. The high-frequency power amplifier can therefore operate in a saturated mode. The output power of the high-frequency power amplifier in the saturated mode is, regardless of the operation class, proportional to the square of the power supply voltage (voltage given to the drain or the collector) for a constant load. That is, the output voltage is proportional to the power supply voltage.

When the proportionally multiplied voltage by the amplitude component of the modulating signal as the power supply voltage of the high-frequency power amplifier is applied, under the condition that the high-frequency power amplifier operates in the saturated mode, the modulated wave of the phase component input into the high-frequency power amplifier is multiplied by the amplitude component in an output section of the high-frequency power amplifier, restoring the linear modulating signal. Described above is a basic operation of the ERR method. In this regard, although the high-frequency power amplifier operates in other than the saturated mode, i.e., the power supply voltage and the output voltage respond non-linearly, the EER method is operable by correcting the distortion.

Since the high-frequency power amplifier involves only the saturation power, non-linearity of the input/output response does not cause a problem. That is, the operation classes, such as the class B, C, F, E or the like, for operating the high-frequency power amplifier in high efficiency can be applied.

The class B is the operation class to operate the high-frequency power amplifier as a half-wave rectifier, flowing the current only through a half section of the input voltage amplitude. As a result of Fourier series transform, while a fundamental wave component of the class B operation has the same amplitude with that of the class A operation and thus the output power is also the same, a DC component is $2/\pi$. Thus, the saturation efficiency reaches 78.5%. The class C is the operation class which cuts back an interval length that the current flows, where an on/off duty ratio of the current shifts from 50%, so that the amplitude of the fundamental wave component is reduced resulting in the decrease in the output power. Moreover, since the DC component and the fundamental wave component vary intricately against the duty ratio, the class C operation may be less efficient than the class B operation depending on the duty ratio. The class F or E is the switching mode operation class, which operates the high-frequency power amplifier as a switch. Since an output current waveform gets closer to a rectangular wave, the efficiency is increased and, furthermore, the fundamental wave component of the current standardized at the maximum DC current gets closer to $2/\pi$. As a result, the output power will increases $(2/\pi)/(1/2)=4/\pi$ times (approximately 1 dB) at the maximum, compared to that of the class B (fundamental wave component is 1/2).

As described above, the EER method enables to power amplify highly efficiently, the modulating signal having the large back off.

Patent Document 1: U.S. Pat. No. 6,377,784 B2 (page 4 of the drawings, FIG. 9)

Patent Document 2: U.S. Pat. No. 6,528,975 B2 (page 4 of the drawings, FIG. 4)

However, in the conventional EER method, when the broadband modulating signal is applied, the operational amplifier 1907 requires a gain bandwidth (Hereinbelow, frequency range where the gain is 1: referred to as GBW) to be broader. For example, a baseband signal of the modulating signal has the band of 100 MHz, the band required for its amplitude component becomes approximately 5 times thereof, so that the operational amplifier 1907 needs to amplify the band of 500 MHz. In the case that the operational amplifier 1907 has a second-order roll-off characteristic, a voltage gain attenuates at 12 dB/oct, so that it requires the GBW of 2 GHz to obtain the gain of 6 dB (double) in the band of 500 MHz. For the implementation, it thus requires the development of a device capable of high-frequency operation, i.e., a device obtaining the high gain at the high frequency, and the circuit technology to compensate a phase delay in an internal circuit at high speed. Moreover, for the broadband modulating signal, it requires the higher-speed sampling frequency of the D/A converter. For the foregoing modulating signal, for example, the required sampling frequency is at least 1 Giga sample per second (Gs/s: double oversampling), requiring the development of an MOS switch capable of being turned on/off at high speed and the high-speed bus technology. As described above, broadbandization of such as the operational amplifier 1907 or the D/A converter, not only increases the power consumption, but also requires a breakthrough of new technology.

SUMMARY OF THE INVENTION

In view of the foregoing problems, the present invention is intended to provide a transmission method and a transmitter circuit readily enabling an EER of a broadband modulating signal.

To solve the foregoing problems, the transmission method of a first invention includes the steps of: detecting an amplitude component from a modulating signal containing a phase component and the amplitude component; direct-current converting the amplitude component and frequency-converting the modulating signal to high frequency; generating a modulated wave by multiplying the direct-current converted amplitude component by the frequency-converted modulating signal; and correcting by a feedback process, a level of the amplitude component to be direct-current converted, wherein: the amplitude component to be direct-current converted is divided into multiple frequency bands; a feedback process not involving frequency conversion is performed for the amplitude component, wherein frequency thereof is selected to fall within at least one first frequency band among the multiple frequency bands; a feedback process involving frequency conversion and frequency inversion is performed for the amplitude component, wherein frequency thereof is selected to fall within at least one second frequency band among the multiple frequency bands; and the amplitude components after operating the feedback process within all of the frequency bands are direct-current converted after being added up with each other.

In the foregoing transmission method, for example, the feedback process is operated for the direct-current converted amplitude component or for the amplitude component contained in the modulated wave.

According to this method, the requirements for a gain bandwidth upon amplifying the amplitude component can be relaxed by dividing the band of the amplitude component separated from the broadband modulating signal. Moreover, the sampling frequency for D/A converting the amplitude component can be reduced, resulting in reduction in the power consumption of the D/A conversion. The method can therefore be applied for the broadband signal, which has been difficult to process by the conventional EER method, enabling the transmitter circuit to be highly efficient using the EER method for the broadband modulating signal.

A transmitter circuit according to a second invention is provided with: modulating signal generating means for generating the modulating signal containing the phase component and the amplitude component; modulating signal detecting means for detecting at least the amplitude component of the modulating signal generated by the modulating signal generating means; direct-current conversion means for outputting the amplitude component detected by the modulating signal detecting means after direct-current conversion; first frequency conversion means for frequency-converting the modulating signal output from the modulating signal generating means to output the modulated wave; and a high-frequency power amplifier for inputting the modulated wave output from the first frequency conversion means and the amplitude component output from the direct-current conversion means to amplify the modulated wave, wherein an output section thereof multiplies the modulated wave by the amplitude component to output.

The transmitter circuit is also provided with modulating signal band dividing means for dividing at least the amplitude component generated by the modulating signal generating means into multiple frequency bands.

Here, the modulating signal band dividing means is configured by at least one first modulating signal band dividing means and at least one second modulating signal band dividing means.

The first modulating signal band dividing means is configured by: at least one first frequency selecting means for frequency-selecting at least the amplitude component generated by the modulating signal detection means; at least one second frequency selecting means for frequency-selecting the amplitude component direct-current converted by the direct-current conversion means within the same frequency band with the first frequency selecting means; first feedback means for feeding back the amplitude component frequency-selected by the second frequency selecting means with a certain feedback amount; and first amplification means for inputting the amplitude components from the first frequency selecting means and from the first feedback means, and for amplifying the amplitude component from the first frequency selecting means.

The second modulation signal band dividing means is configured by: at least one third frequency selecting means for frequency-selecting at least the amplitude component generated by the modulating signal detecting means; at least one second frequency converting means for frequency-converting the amplitude component frequency-selected by the third frequency selecting means; at least one fourth frequency selecting means for frequency-selecting the amplitude component direct-current converted by the direct-current conversion means within the same frequency band with the third frequency selecting means; third frequency conversion means for frequency-converting the amplitude component frequency-selected by said fourth frequency selecting means similarly with the second frequency conversion means; second feedback means for feeding back the amplitude component frequency-selected by the third frequency selecting means with a certain feedback amount; second amplification means for inputting the amplitude components from the second frequency conversion means and from the second feedback means, and for amplifying the amplitude component from the second frequency conversion means; and fourth frequency conversion means for frequency-converting the amplitude component from the second amplification means inversely with the second frequency conversion means.

The transmitter circuit is also provided with adding means for adding up the amplitude component from the first modulating signal band dividing means and the amplitude component from the second modulating signal band dividing means, and for outputting the added signal to the direct-current conversion means.

With the transmitter circuit according to the second invention, the requirements for the gain bandwidth of the amplification means can be relaxed by dividing the band of the amplitude component separated from the broadband modulating signal. Moreover, the sampling frequency for the D/A converter for the amplitude component can be reduced, resulting in reduction in the power consumption of the D/A converter. The circuit can therefore be applied for the broadband signal, which has been difficult to process by the conventional EER method, enabling the transmitter circuit to be highly efficient using the EER method for the broadband modulating signal.

Here, the second frequency conversion means preferably converts the frequency band of the amplitude component from the third frequency selecting means to the same frequency band with the amplitude component from the first frequency selecting means.

While, in the conventional EER method, the phase component of the modulating signal is input into a high-frequency input terminal of the high-frequency power amplifier, it is required to increase the sampling frequency of the D/A converter upon D/A conversion of the phase signal due to the phase component of the broadband modulation signal expanding to more than 5 times of the initial modulation band as well as the amplitude component thereof, resulting in the disadvantage in terms of the power consumption. Moreover, the signal is not a constant envelope signal because it lacks the phase component having the high frequency by the band limitation being applied. That is, while the signal moves with a certain angular velocity in a symbol map having a constant envelope property before applying the band limitation, the angular velocity is limited by applying the band limitation. As a result of that, it becomes impossible for the signal to move a distance between symbol points where it should inherently move therebetween, and instead the signal samples a straight line connecting the symbol points. Thus, it is not the constant envelope signal and it contains a phase error at this point. Furthermore, by saturating the modulated wave without the constant envelope property using the high-frequency power amplifier, the gain of the signal containing the error will be increased. Hence, the influence by the symbol points becomes measurable, which has been negligible regardless of the presence of the error because the amplitude was small, resulting in the modulation accuracy being substantially decreased. By inputting an IQ signal into the high-frequency input terminal of the high-frequency power amplifier as described in the configuration of the present invention, the band of the signal to be processed can stay the same as that of the initial modulating signal. Hence, the sampling frequency for the D/A converter built in, for example, the modulating signal generating circuit can be reduced, the need of filtering before D/A conversion can be eliminated, and the modulating signal is not deteriorated by D/A conversion. Additionally, since the band of the high-frequency power amplifier is generally several hundreds MHz and is not limited, the saturated signal from the high-frequency power amplifier is the complete constant envelope signal without lack, as long as the high-frequency power amplifier is the complete saturation type power amplifier. However, while the high-frequency power amplifier cannot be the saturation type power amplifier, especially when the low power supply voltage is provided, the signal cannot be the constant envelope signal at the low amplitude. In this case, the amplitude component and the saturated modulating signal are multiplied with each other at the output side of the high-frequency power amplifier, square-law characteristic of the amplitude is obtained at the low amplitude side. It results in the need for distortion compensation. The distortion compensation is achieved by, for example, inputting the modulating signals having an identical form into the high-frequency terminal and the power supply terminal of the high-frequency power amplifier, estimating a function of the distortion characteristic of the high-frequency power amplifier based on the modulating signal output from the high-frequency power amplifier, and applying an inverse function thereof to the initial modulating signal. It can be configured that the resulting signal is output from the modulating signal generating circuit.

Here, the modulating signal detection means also detects the phase component of the modulating signal, and the modulating signal input into the first frequency conversion means is preferably the phase component from the modulating signal detection means.

When the transmitter circuit according to the second invention is provided with the first frequency conversion means and the high-frequency power amplifier configured internally by multistage circuits, a back off operation has been required for a block or an amplifier stage not involving a saturation operation. The back off operation decreases the efficiency of such block or amplifier stage. However, since the complete constant envelope signal is input using the configuration as described above, the back off operation is not required, allowing the block or the amplifier stage to operate in high efficiency.

It is also preferable that: the modulating signal generating means, the modulating signal detecting means, the first and third frequency selecting means, and the second frequency conversion means are integrated as a first integrated circuit; the first and second amplification means, the adding means, the second and fourth frequency selecting means, the first, third and fourth frequency conversion means, and the first and second feedback means are integrated as a second integrated circuit; and the high-frequency power amplifier and the direct-current conversion means are integrated as a third integrated circuit.

According to the configuration, since the first integrated circuit can be fabricated using a digital CMOS process for microfabrication suitable for processing a digital signal, the circuit can be miniaturized by the CMOS process and the power consumption and the chip area can be reduced as well.

The second integrated circuit can be fabricated using a high integration process, such as an analog CMOS process or a BiCMOS process, suitable for an analog circuit. The CMOS process or a bipolar process optimized for analog fabrication is superior to the digital CMOS process specialized for microfabrication in terms of high power characteristics, such as a withstanding voltage, and the resulting circuit can process the analog signal with a large amplitude. The bipolar process has excellent high-frequency characteristics, allowing the first and second frequency conversion circuits to up-convert or down-convert the modulating signal into a GHz band. Moreover, since it is possible to incorporate a logic circuit, Phase Locked Loop (PLL) can be integrated to integrate a stable signal source.

Since the third integrated circuit integrates a block required to satisfy the high-frequency characteristics and the high power characteristics altogether, it is generally difficult to be achieved using the analog CMOS process or the bipolar process. However, by configuring the integrated circuit of a compound semiconductor, such as GaAs, a transistor can be achieved with a cut-off frequency or a maximum oscillating frequency over 100 GHz and a certain amount of withstanding voltage. Thus, it is possible to achieve the high-frequency power amplifier or the direct-current converter requiring the high-frequency characteristics as well as the withstanding voltage or the high power characteristics.

A third transmitter circuit is provided with: modulating signal generating means for generating the modulating signal containing the phase component and the amplitude component; first modulating signal detecting means for detecting at least the amplitude component of the modulating signal generated by the modulating signal generating means; first frequency selecting means for frequency-selecting at least the amplitude component detected by the first modulating signal detecting means; second frequency selecting means for selecting frequency different from the frequency selected by the first frequency selecting means of at least the amplitude component detected by the first modulating signal detecting means; direct-current conversion means; first frequency conversion means for frequency-converting the modulating signal output from the modulating signal generating means; a high-frequency power amplifier for inputting the modulated wave output from the first frequency conversion means and the amplitude signal from the direct-current conversion means to amplify the modulated wave, wherein the output section thereof multiplies the modulated wave by the amplitude component to output; feedback means for feeding back the output power from the high-frequency power amplifier; second frequency conversion means for frequency-converting the output power from the feedback means inversely with the first frequency conversion means; second modulating signal detecting means for detecting at least the amplitude component of the output signal from the second frequency conversion means; first comparison correction means for comparing two signals from the second modulating signal detecting means and the first frequency selecting means to generate the amplitude signal corrected based on the comparison result; second comparison correction means for comparing two signals from the second modulating signal detecting means and the second frequency selecting means to generate the amplitude signal corrected based on the comparison result; first amplification means for amplifying the amplitude signal from the first comparison correction means; third frequency conversion means for frequency-converting the amplitude signal from the second comparison correction means; second amplification means for amplifying the amplitude signal from the third frequency conversion means; fourth frequency conversion means for frequency-converting the amplitude signal output from the second amplification means inversely with the third frequency conversion means; and adding means for adding up the amplitude signal output from the first amplification means with the amplitude signal output from the fourth frequency conversion means to output to the direct-current conversion means.

With the transmitter circuit according to the third invention, the requirements for the gain bandwidth of the first and second amplification means can be relaxed by dividing the band of the amplitude component separated from the broadband modulating signal. Moreover, the sampling frequency for the D/A converter to D/A convert the amplitude component can be reduced, resulting in reduction in the power consumption of the D/A converter. Hence, the circuit can be readily applied for the broadband signal, which has been difficult to process by the conventional EER method, enabling the transmitter circuit to be highly efficient using the EER method for the broadband modulating signal.

Here, the third frequency conversion means preferably converts the frequency band of the amplitude signal from the second comparison correction means to the same frequency band of the amplitude signal from the first comparison correction means.

While, in the conventional EER method, the phase component of the modulating signal is input into the high-frequency input terminal of the high-frequency power amplifier, it is required to increase the sampling frequency of the D/A converter upon D/A conversion of the phase signal due to the phase component of the broadband signal expanding to more than 5 times of the initial modulation band as well as the amplitude component thereof, resulting in the disadvantage in terms of the power consumption. Moreover, the signal is not a constant envelope signal because it lacks the phase component having the high frequency by the band limitation being applied. That is, while the signal moves with a certain angular velocity in the symbol map having the constant envelope property before applying the band limitation, the angular velocity is limited by applying the band limitation. Due to that reason, it becomes impossible for the signal to move a distance between symbol points where it should inherently move therebetween, and instead the signal samples a straight line connecting the symbol points. Thus, it is not the constant envelope signal and it contains the phase error at this point. Furthermore, by saturating the modulated wave without the constant envelope property using the high-frequency power amplifier, the gain of the signal containing the error increases.

Hence, the influence by the symbol points becomes measurable, which has been negligible regardless of the presence of the error because the amplitude was small, resulting in the modulation accuracy being substantially decreased. According to this configuration, however, by inputting the IQ signal into the high-frequency input terminal of the high-frequency power amplifier, the band of the signal to be processed can stay the same as that of the initial modulating signal. Thus, the sampling frequency for the D/A converter can be reduced, the need of filtering before the D/A converter can be eliminated, and the modulating signal is not deteriorated by D/A conversion.

Additionally, since the band of the high-frequency power amplifier is generally several hundreds MHz and is not limited, the saturated signal from the high-frequency power amplifier is the complete constant envelope signal without lack, as long as the high-frequency power amplifier is the complete saturation type amplifier. However, while the high-frequency power amplifier cannot be the saturation type amplifier, especially when the low power supply voltage is provided, the signal cannot be the constant envelope signal at the low amplitude. In this case, the amplitude component and the saturated modulating signal are multiplied with each other at the output side of the high-frequency power amplifier, the square-law characteristic of the amplitude is obtained at the low amplitude side. However, it does not cause a problem in the present invention because the characteristic is corrected as well by the first and second comparison correction means as a non-linear distortion.

Here, it is preferable that: the first and second modulating signal detecting means also detect the phase component of the modulating signal; the circuit is also provided with third comparison correction means for comparing the signal including an amplitude phase from the first modulating signal detecting means with the signal including the amplitude phase from the second modulating signal detecting means to generate the phase signal corrected based on the comparison result; and the input signal of the first frequency conversion means is the phase component output from the third comparison correction means.

It is also preferable that: the modulating signal generating means, the first and second modulating signal detecting means, the first and second comparison correction means, the first and second frequency selecting means, and the third frequency conversion means are integrated as a first integrated circuit; the first and second amplification means, the adding means, and the first, second and fourth frequency conversion means are integrated as a second integrated circuit; and the high-frequency power amplifier, the feedback means, and the direct-current conversion means are integrated as a third integrated circuit.

According to the configuration, since the first integrated circuit can be fabricated using the digital CMOS process for microfabrication suitable for processing the digital signal, the circuit can be miniaturized by the CMOS process and the power consumption and the chip area can be reduced as well.

The second integrated circuit can be fabricated using the high integration process, such as the analog CMOS process or the BiCMOS process, suitable for the analog circuit. The CMOS process or the bipolar process optimized for analog fabrication is superior to the digital CMOS process specialized for microfabrication in terms of the high power characteristics, such as the withstanding voltage, and the resulting circuit can process the analog signal with a large amplitude. The bipolar process has the excellent high-frequency characteristics, allowing the first and second frequency conversion circuits to up-convert or down-convert the modulating signal into the GHz band. Moreover, since it is possible to incorporate the logic circuit, Phase Locked Loop (PLL) can be integrated to integrate the stable signal source.

Since the third integrated circuit integrates the block required to satisfy the high-frequency characteristics and the high power characteristics altogether, it is generally difficult to be achieved using the analog CMOS process or the bipolar process. However, by configuring the integrated circuit of the compound semiconductor, such as GaAs, the transistor can be achieved with the cut-off frequency or the maximum oscillating frequency over 100 GHz and a certain amount of withstanding voltage. Thus, it is possible to achieve the high-frequency power amplifier or the direct-current converter requiring the high-frequency characteristics as well as the withstanding voltage or the high power characteristics.

Furthermore, it is preferable that the third comparison correction means is also integrated in the second integrated circuit.

As described above, while the processable band of the modulating signal has been limited by the band of the amplifier and the D/A converter when using the conventional EER method, the transmitter circuit according to the present invention realizes the EER method for the broadband modulating signal regardless of the broadness of the modulating signal band because the modulating signal band can be divided to fall within the band of the amplifier or the D/A converter.

DESCRIPTION OF THE PREFERRED EMBODIMENTS

First Embodiment

Hereinafter, the first embodiment according to first and second inventions will be described by reference to the drawings. In this embodiment, an OFDM modulation method is employed as a modulation method. The system using the OFDM modulation method includes, for example, a wireless LAN system of the IEEE 802.11a standard. In the wireless LAN system, a primary modulation such as 64 QAM, 16 QAM, QPSK, or BPSK is performed for each of the orthogonal 52 sub-carriers and then Inverse Fast Fourier Transform (IFFT) is performed, and then all the sub-carriers are added up with each other to obtain the OFDM modulating signal. A symbol rate before the IFFT is set to 20 MHz and the IFFT size is a power value of 2 proximate to 52, i.e., 64. As a result, a data rate provided to the respective sub-carriers after serial parallel conversion is 20 MHz/64, i.e., 312.5 kHz. Hence, the lowest frequency of the sub-carriers is 312.5 kHz, while the higher-order sub-carrier has the frequency, which is an integral multiple of the fundamental frequency. That is, the 52 sub-carriers are separated from each other by 312.5 kHz, occupying 52×312.5=16.45 MHz.

Figure 1:
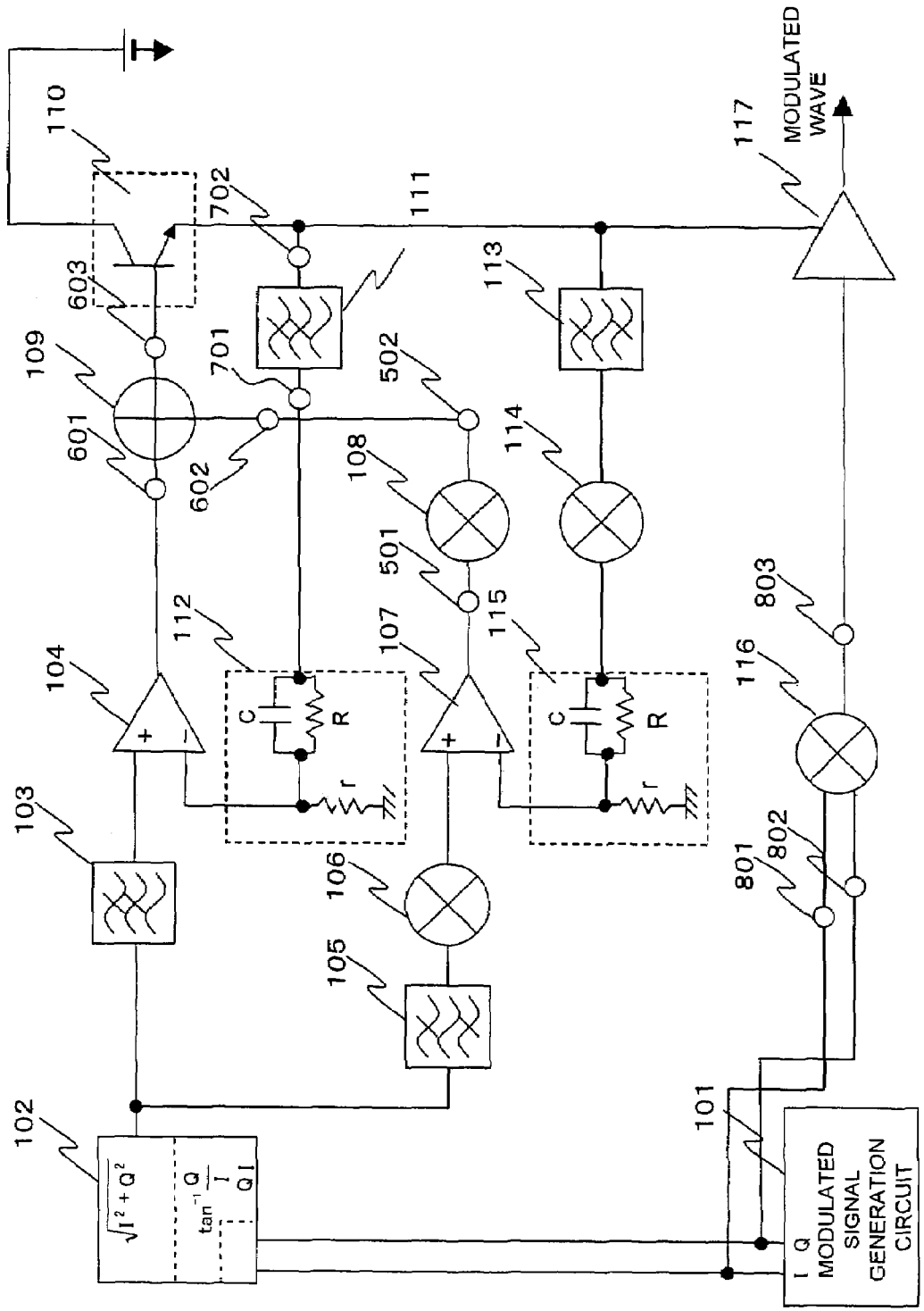
FIG. 1 is a block circuit diagram of a transmitter circuit according to a first embodiment.

FIG. 1 is a block circuit diagram of the transmitter circuit for implementing the EER method according to the first embodiment of the present invention. The transmitter circuit is configured by, as shown in this figure, a modulating signal generating circuit 101 for generating the OFDM modulating signal containing an amplitude component and a phase component, a detection circuit 102 for detecting the amplitude component of the OFDM modulating signal generated by the modulating signal generating circuit 101, a frequency selecting circuit 103 for dividedly selecting a frequency band of the amplitude component detected by the detection circuit 102, an operational amplifier 104 for amplifying the amplitude component having the band selected by the frequency selecting circuit 103, a frequency selecting circuit 105 for dividedly selecting the frequency band of the amplitude component detected by the detection circuit 102, a frequency conversion circuit 106 for frequency-converting the amplitude component having the band selected by the frequency selecting circuit 105, an operational amplifier 107 for amplifying the amplitude component frequency-converted by the frequency conversion circuit 106, a frequency conversion circuit 108 for frequency-converting the amplitude component amplified by the operational amplifier 107, an adder 109 for adding up the amplitude components from the operational amplifier 104 and from the frequency conversion circuit 108, a direct-current (DC) converter 110 for DC converting the amplitude component added up by the adder 109, a frequency selecting circuit 111 disposed on an output side of the DC converter 110 for dividedly selecting the frequency band of the amplitude component DC converted by the DC converter 110, a feedback circuit 112 for feeding a portion of the amplitude component having the band selected by the frequency selecting circuit 111 back to a feedback terminal of the operational amplifier 104, a frequency selecting circuit 113 disposed on an output side of the DC converter 110 for dividedly selecting the frequency band of the amplitude component DC converted by the DC converter 110, a frequency conversion circuit 114 for frequency-converting the amplitude component having the band selected by the frequency selecting circuit 113, a feedback circuit 115 for feeding a portion of the amplitude component frequency converted by the frequency conversion circuit 114 back to a feedback terminal of the operational amplifier 107, a frequency conversion circuit 116 for frequency-converting the modulating signal from the modulating signal generating circuit 101, and a high-frequency power amplifier 117 for inputting a modulated wave from the frequency conversion circuit 116 and the amplitude component from the DC converter 110 into a high-frequency input terminal and a power supply terminal, respectively, and for outputting the product of the modulated wave obtained by amplifying the above modulated wave and the above amplitude component.

Here, the modulating signal generating circuit 101 corresponds to modulating signal generating means. The detection circuit 102 corresponds to modulating signal detecting means. The frequency selecting circuit 103 corresponds to first frequency selecting means. The frequency selecting circuit 111 corresponds to second frequency selecting means. The frequency selecting circuit 105 corresponds to third frequency selecting means. The frequency selecting circuit 113 corresponds to fourth frequency selecting means. The operational amplifier 104 corresponds to first amplification means. The operational amplifier 107 corresponds to second amplification means. The adder 109 corresponds to adding means. The DC converter 110 corresponds to DC conversion means. The feedback circuit 112 corresponds to first feedback means. The feedback circuit 115 corresponds to second feedback means. The frequency conversion circuit 116 corresponds to first frequency conversion means. The frequency conversion circuit 106 corresponds to second frequency conversion means. The frequency conversion circuit 114 corresponds to third frequency conversion means. The frequency conversion circuit 108 corresponds to fourth frequency conversion means.

The modulating signal generating circuit 101 is for generating the above-described OFDM modulating signal. The OFDM modulating signal generated by the modulating signal generating circuit 101 is input into the detection circuit 102.

The detection circuit 102 detects the phase component and the amplitude component of the OFDM modulating signal separately. In particular, vector signals I, Q of the OFDM modulating signal generated by the modulating signal generating circuit 101 are converted to polar coordinates and detected as the amplitude component $\sqrt{(I^2+Q^2)}$ and the phase component $\tan^{-1}(Q/I)$, separately. The detected amplitude component is input into the frequency selecting circuit 103 and the frequency selecting circuit 105.

Figure 2:
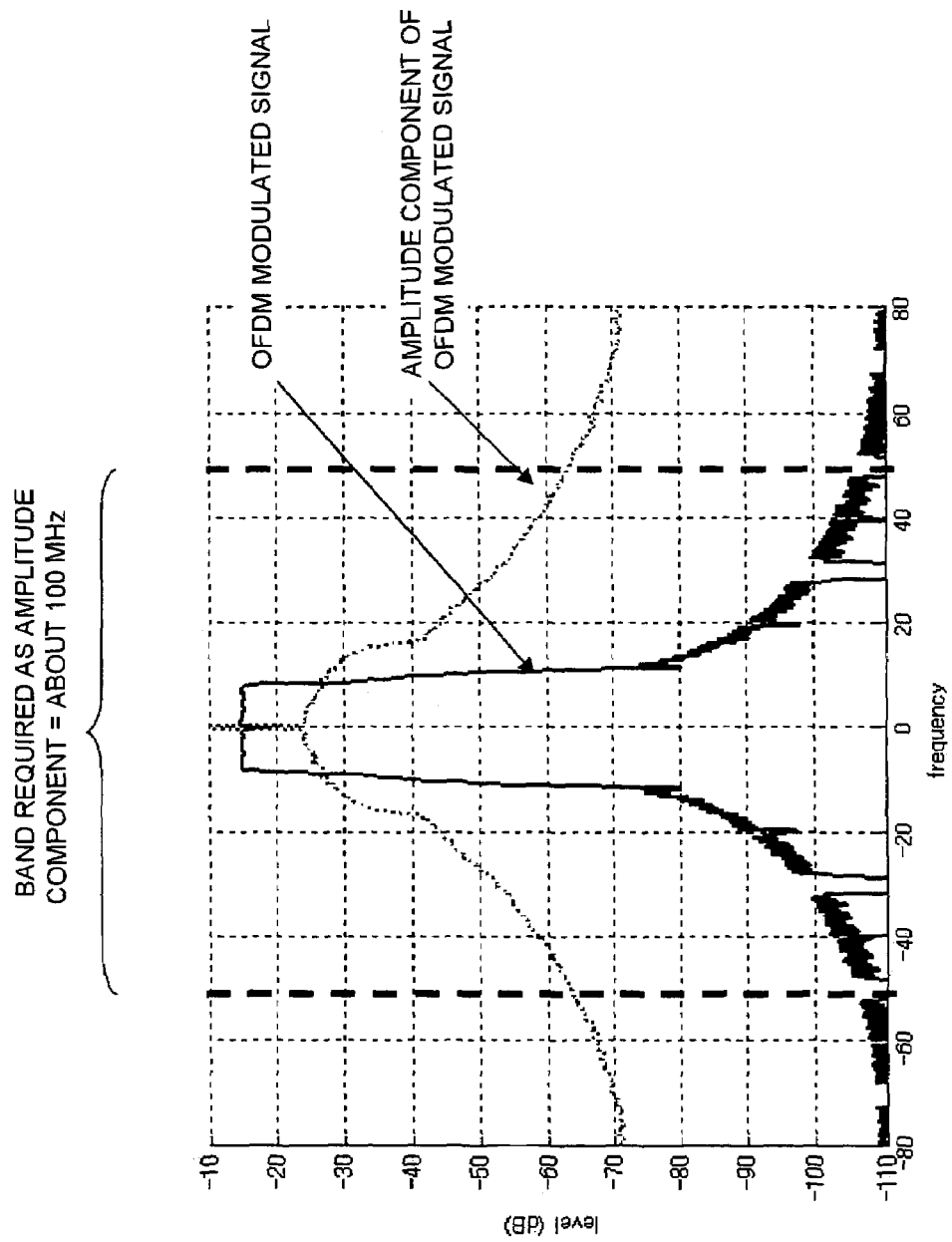
FIG. 2 is a graph illustrating a variation example of a signal processed in the transmitter circuit according to the first embodiment.

For the OFDM modulating signal of the IEEE 802.11a standard, the detected amplitude component is as shown in FIG. 2. A broken line represents the amplitude component of the OFDM modulating signal detected by the detection circuit 102, while a solid line represents the OFDM modulating signal generated by the modulating signal generating circuit 101. As shown, the detected amplitude component exhibits a spread band. It is impossible to transmit such spread signal as the analog signal due to the limitations of the D/A converter, therefore the band limitation needs to be implemented.

Figure 3:
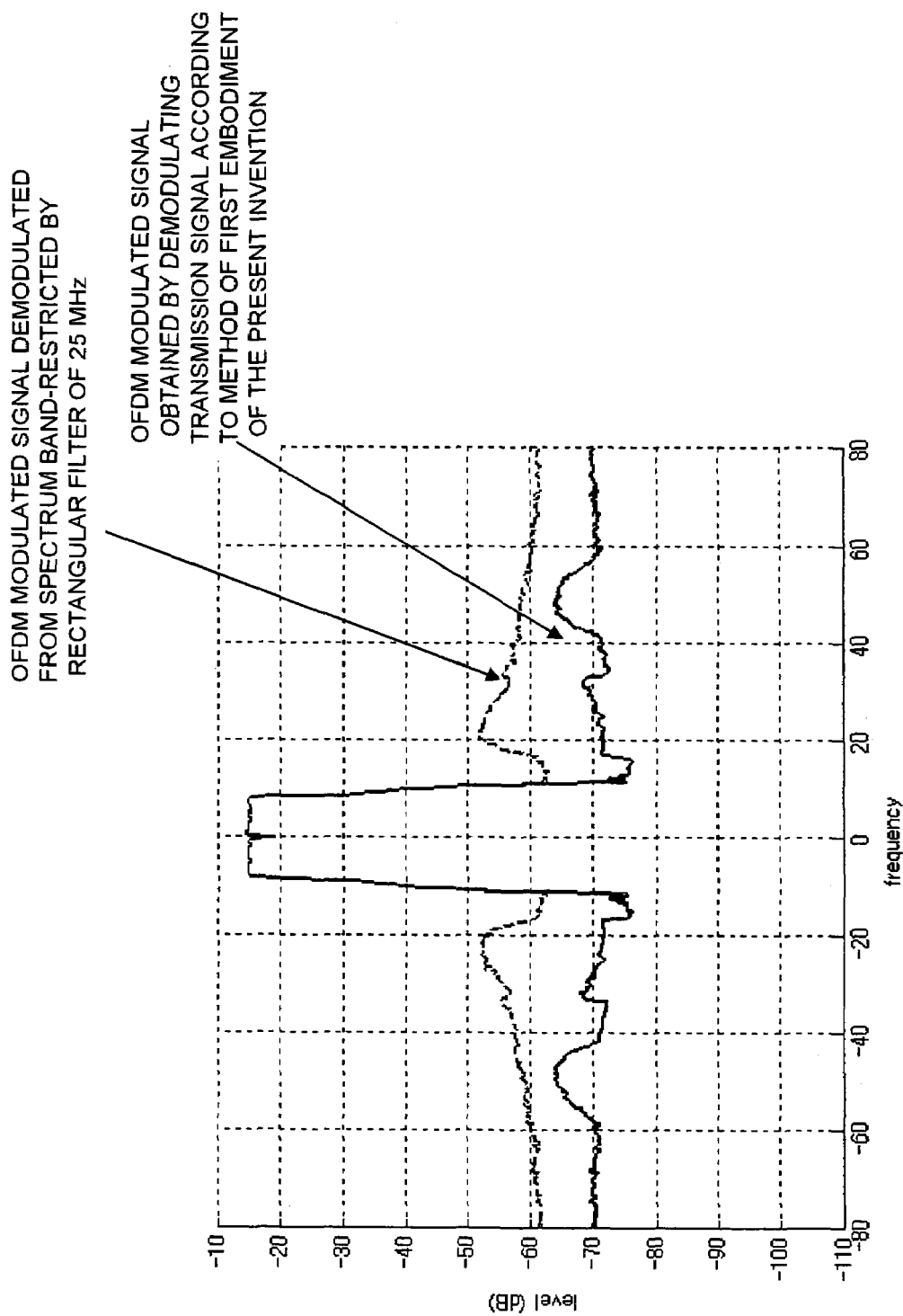
FIG. 3 is a graph illustrating an effect of the transmitter circuit according to the first embodiment.

FIG. 3 shows a spectrum of the OFDM modulating signal demodulated by multiplying the amplitude component of the OFDM modulating signal after applying the band limitation of the cut-off frequency of 25 MHz using an ideal rectangular 400-tap FIR filter by the phase component detected by the detection circuit 102. While a spectrum mask defined by the IEEE 802.11a standard has the limit of 40 dBc at the offset equal to or larger than 30 MHz from the center frequency, it can be appreciated in FIG. 3 that the band limitation of the amplitude component at 25 MHz results in the spectrum after the EER not satisfying the spectrum mask standard.

FIG. 3 also shows a spectrum of the OFDM modulating signal, obtained by providing the frequency selection circuits 103 and 105 with a low-pass characteristic (Low Pass Filter: LPF) having the cut-off frequency of 25 MHz and a band-pass characteristic (Band Pass Filter: BPF) having the center frequency of 37.5 MHz and the bandwidth of 25 MHz, respectively, and by once dividing the amplitude component by a frequency domain and multiplying the recombined amplitude component by the phase component to demodulate the OFDM signal. While the LPF applies the 400-tap FIR filter as described above, the BPF is obtained by frequency shifting the LPF characteristic of the 400-tap filter. As shown in this figure, deterioration of the spectrum due to recombination of the band-divided signal is not problematic, and the spectrum satisfies the requirements of the spectrum mask leaving an allowance for the spectrum mask. That is, the modulating signal can be divided by the frequency domain and then recombined.

Figure 4:
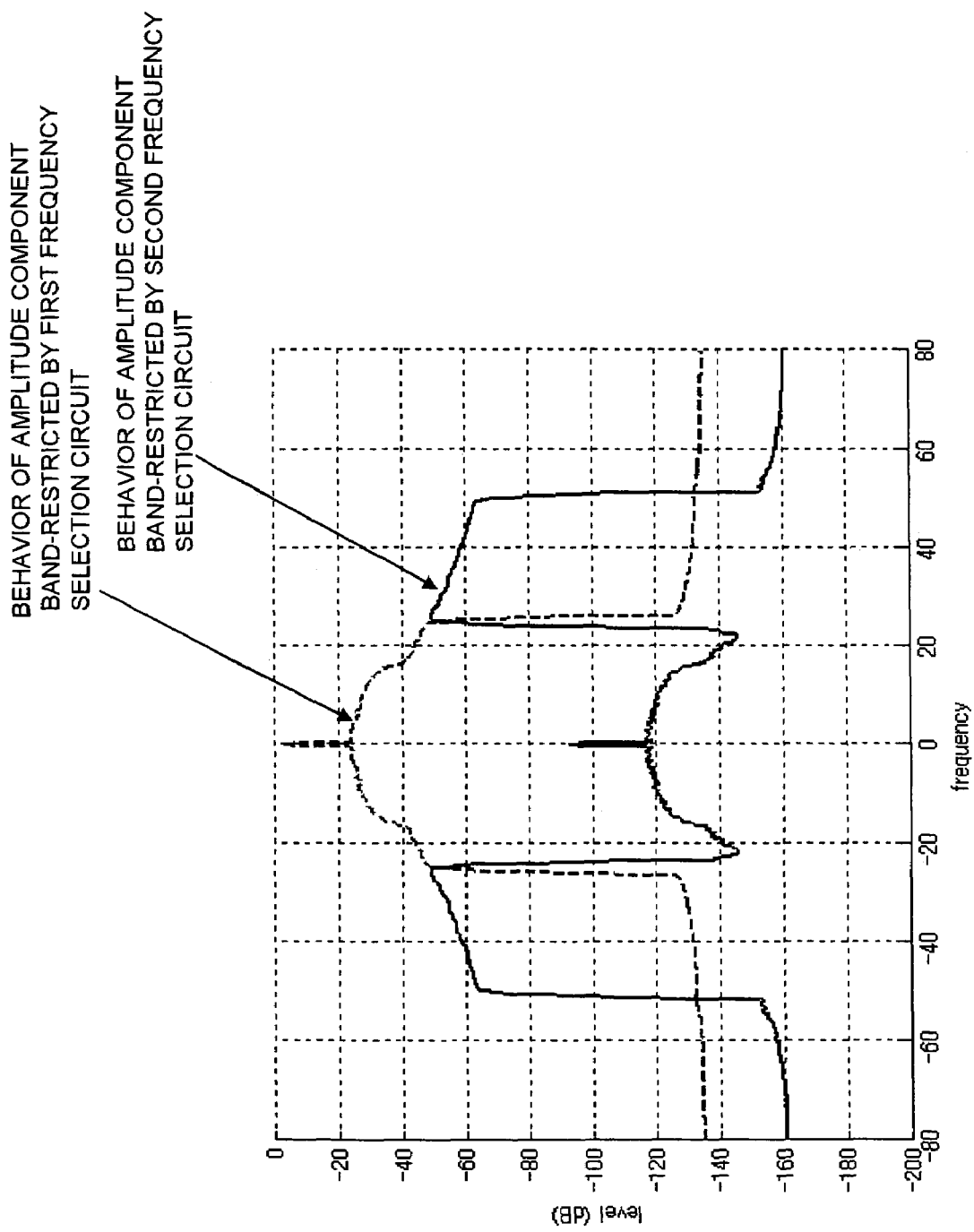
FIG. 4 is a graph illustrating a variation example of the signal processed in the transmitter circuit according to the first embodiment.

As described, in this embodiment, the frequency selecting circuits 103 and 105 are provided with selectivity, i.e., the cut-off frequency of 25 MHz, and the center frequency of 37.5 MHz and the bandwidth of 25 MHz, respectively. FIG. 4 shows an aspect of the band-limited amplitude component in accordance with the foregoing specification.

The frequency conversion circuit 106 frequency-converts the amplitude component, which is frequency selected by the frequency selecting circuit 105, so that the cut-off frequency of the low-frequency side of the amplitude component is a DC component. The frequency conversion can be processed by computing the initial signal with exp(jωt) (where ω is the frequency to be shifted).

The amplitude component selected by the frequency selecting circuit 103 is amplified by a required amount using the operational amplifier 104 after the D/A conversion. Here, the D/A conversion may be performed either by the frequency selecting circuit 103 or by the operational amplifier 104. The amplification amount is determined by the voltage gain of the adder 109, the DC converter 110, the frequency selecting circuit 111, and the feedback circuit 112.

That is, the following formula can be obtained in the case of non-inverting amplifier connection, where: Zi is an input impedance, Zo is an output impedance, is is an input current, io is an output current of the operational amplifier 104; G1 is the voltage gain of the adder 109 in the direction from the operational amplifier 104 to the DC converter 110; G2 is the voltage gain of the DC converter 110 in the direction from the adder 109 to the high-frequency power amplifier 117; G3 is the voltage gain of the frequency selecting circuit 111 in the direction from the DC converter 110 to the feedback circuit 112; G4 is the voltage gain of the feedback circuit 112 in the direction from the frequency selecting circuit 111 to the feedback terminal of the operational amplifier 104; Vin is an input voltage, VF is a voltage of the feedback terminal, Vo is an output voltage of the operational amplifier 104; and Vout is an output voltage of the DC converter 110.

$$Vo = A \cdot Zi \cdot is - Zo \cdot io$$ [Formula 7]
$$Vout = G1 \cdot G2 \cdot Vo$$
$$VF = G3 \cdot G4 \cdot Vout$$

-continued
$$Vin - VF = Zi \cdot is$$
$$Vin - G3 \cdot G4 \cdot Vout = \frac{\left(\frac{Vout}{G1 \cdot G2} + Zo \cdot io\right)}{A}$$

Assuming that the output impedance of the operational amplifier 104 is sufficiently small, the foregoing formula is modified as follows:

$$\frac{Vout}{Vin} = \frac{1}{\frac{1}{A \cdot G1 \cdot G2} + G3 \cdot G4}$$ [Formula 8]

Assuming that the product of an open-loop gain A of the operational amplifier 104, the voltage gain G1 of the adder 109, and the voltage gain G2 of the DC converter 110 is sufficiently large, the formula can be simplified as follows:

$$\frac{Vout}{Vin} = \frac{1}{G3 \cdot G4}$$ [Formula 9]

That is, the voltage gain of the operational amplifier 104 is an inverse number of the voltage gains of the frequency selecting circuit 111 and the feedback circuit 112.

The amplitude component which is frequency converted by the frequency conversion circuit 106 is amplified by the operational amplifier 107. The voltage gain of the operational amplifier 107 is similarly determined by the inverse number of the product of the voltage gains of the frequency selecting circuit 113, the frequency conversion circuit 114, and the feedback circuit 115. The D/A conversion may be performed either by the operational amplifier 107 or by the frequency conversion circuit 106.

The amplitude component output from the operational amplifier 107 is restored to the frequency, which is that before being frequency-converted by the frequency conversion circuit 106, using the frequency conversion circuit 108. Since, in this embodiment, the amplitude component is divided into 25 MHz segments as described above, the frequency is converted to the signal having the center frequency 37.5 MHz and the band 25 MHz, which is that before being frequency-converted by the frequency conversion circuit 106, by frequency-converting the component at the local oscillating frequency 25 MHz using the frequency conversion circuit 108.

Here, assuming that the gain of the frequency conversion circuit 108 is G6, the voltage amplitude of (the voltage amplitude of the DC converter 110)/(G1G2G6) is input into the frequency conversion circuit 108. Where G1G2G6 is 12 dB and the maximum amplitude of the output from the DC converter 110 is the peak voltage 3 V, the maximum input peak voltage of the frequency conversion circuit 108 is as high as 0.75 V (equivalent to the power 1.5 dBm).

Although a multiplier circuit generally requires a large local oscillation input, frequency conversion can also be performed in the case where the signal of the local oscillator is small, as described below, because the amplitude component in this example has the large amplitude.

Figure 5:
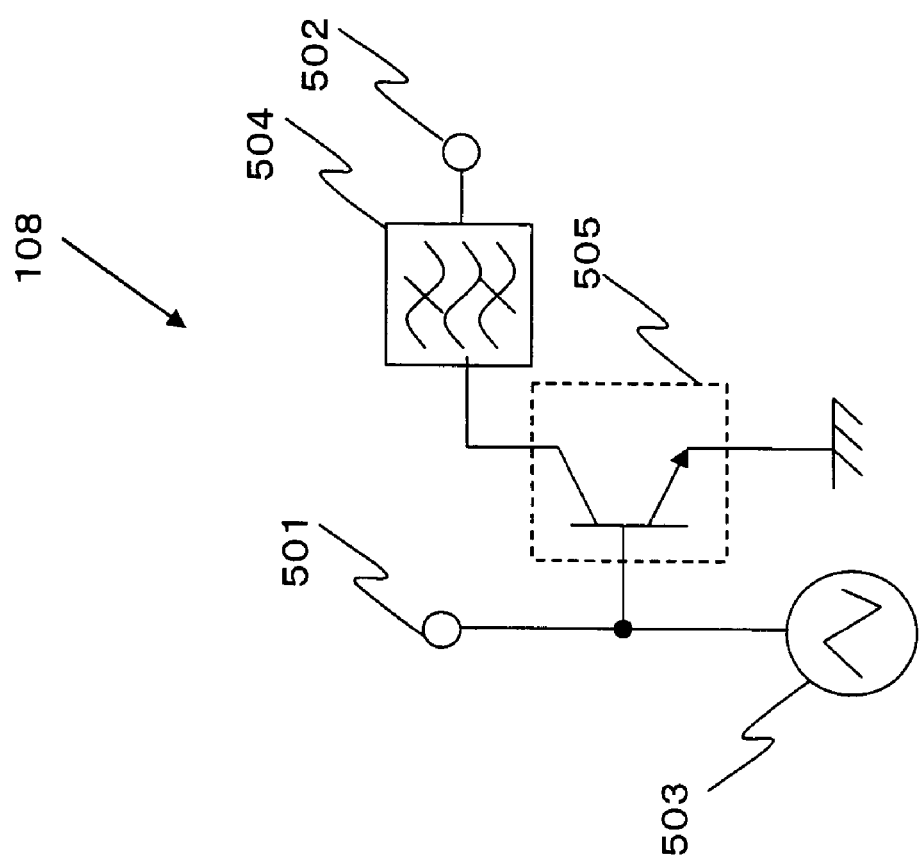
FIG. 5 is a circuit diagram of a frequency conversion circuit 116 according to the first embodiment configured with an active mixer using a bipolar transistor.

Here, consider the multiplier as shown in FIG. 5 utilizing non-linearity of a conductance of a bipolar transistor. Terminals 501 and 502 in FIG. 5 correspond to the respective terminals in FIG. 1 of the same reference numerals. Since the voltage amplitude of the amplitude component input from the terminal 501 is large, the conductance $gm_{RF}$ of the bipolar transistor 505 is expressed as in the following formula having a non-linear component.

$$gm_{RF} = gm_{\max}\left(\frac{1}{2} + \sum_{k=1}^{\infty}\frac{2}{k\pi}\sin k\omega_{RF}t\right) \quad \text{[Formula 10]}$$

Moreover, Fourier series expansion is based on the assumption that the change in conductance due to the input voltage is rectangular having a duty ratio of 50%, and the conductance $gm_{max}$ represents the maximum value of the rectangle. In this manner, by inputting the signal voltage $V_{LO}\sin\omega t$ of the local oscillator 503 into the bipolar transistor 505 having the non-linear conductance, the resulting output current $i_{out}$ of the bipolar transistor 505 is as in the following formula.

$$\begin{aligned}i_{out} &= gm_{RF}v_{LO}\sin(\omega_{LO}t+\theta) \quad \text{[Formula 11]}\\ &\cong \frac{1}{2}gm_{\max}v_{LO}\sin(\omega_{LO}t+\theta) + \\ & \frac{gm_{\max}v_{LO}}{\pi}(\cos\theta - \cos(2\omega_{RF}t+\theta)) + \\ & \frac{gm_{\max}v_{LO}}{2\pi}(\cos(\omega_{RF}t-\theta) - \cos(2\omega_{RF}t+\theta)) + \\ & \frac{gm_{\max}v_{LO}}{3\pi}(\cos(2\omega_{RF}t-\theta) - \cos(4\omega_{RF}t+\theta))\end{aligned}$$

Here, $\omega_{RF}$ is the frequency of the amplitude component and $\omega_{LO}$ is the frequency of the local oscillator. The foregoing formula represents the result when $\omega_{LO}=\omega_{RF}$. That is, while the non-linearity of the conductance is obtained generally by increasing the input into the local oscillator 503, the same effect can also be achieved in the case that the input of the amplitude component is large, as expressed in the foregoing formula. In this instance, it is indicated that the frequency conversion can also be performed in the case that the output from the local oscillator 503 is small.

The output current $i_{out}$ is converted to the voltage by a load, i.e., the impedance of a band-pass filter 504, and a spurious component thereof is removed by the band-pass filter 504, thereby the desired frequency-converted amplitude component as expressed in the following formula can be obtained.

$$-\frac{gm_{\max}v_{LO}}{\pi}\cos(2\omega_{RF}t+\theta)+\frac{gm_{\max}v_{LO}}{3\pi}\cos(2\omega_{RF}t-\theta) \quad \text{[Formula 12]}$$

Assuming that the second term is small and negligible, the foregoing formula is modified as follows.

$$-\frac{gm_{\max}v_{LO}}{\pi}\cos(2\omega_{RF}t+\theta) \quad \text{[Formula 13]}$$

Where the above-described load impedance is $Z_L$, the output voltage signal is as follows.

$$-Z_L\left(-\frac{gm_{\max}v_{LO}}{\pi}\cos(2\omega_{RF}t+\theta)\right) \quad \text{[Formula 14]}$$

Thus, the phase is determined by the load ZL, i.e., the impedance of the band-pass filter 504, and the phase of the local oscillator 503. The phase of the local oscillator 503 may be adjusted by, for example, adjusting a signal line length. Where the band-pass filter 504 can be configured by a series connection of a phase lead circuit, such as the feedback circuits 112 and 115 in FIG. 1, and the low-pass filter in FIG. 7, a phase delay of the loop can be minimized.

The amplitude components output from the frequency conversion circuit 108 and the operational amplifier 104 are respectively input and added up in the adder 109.

Figure 6:
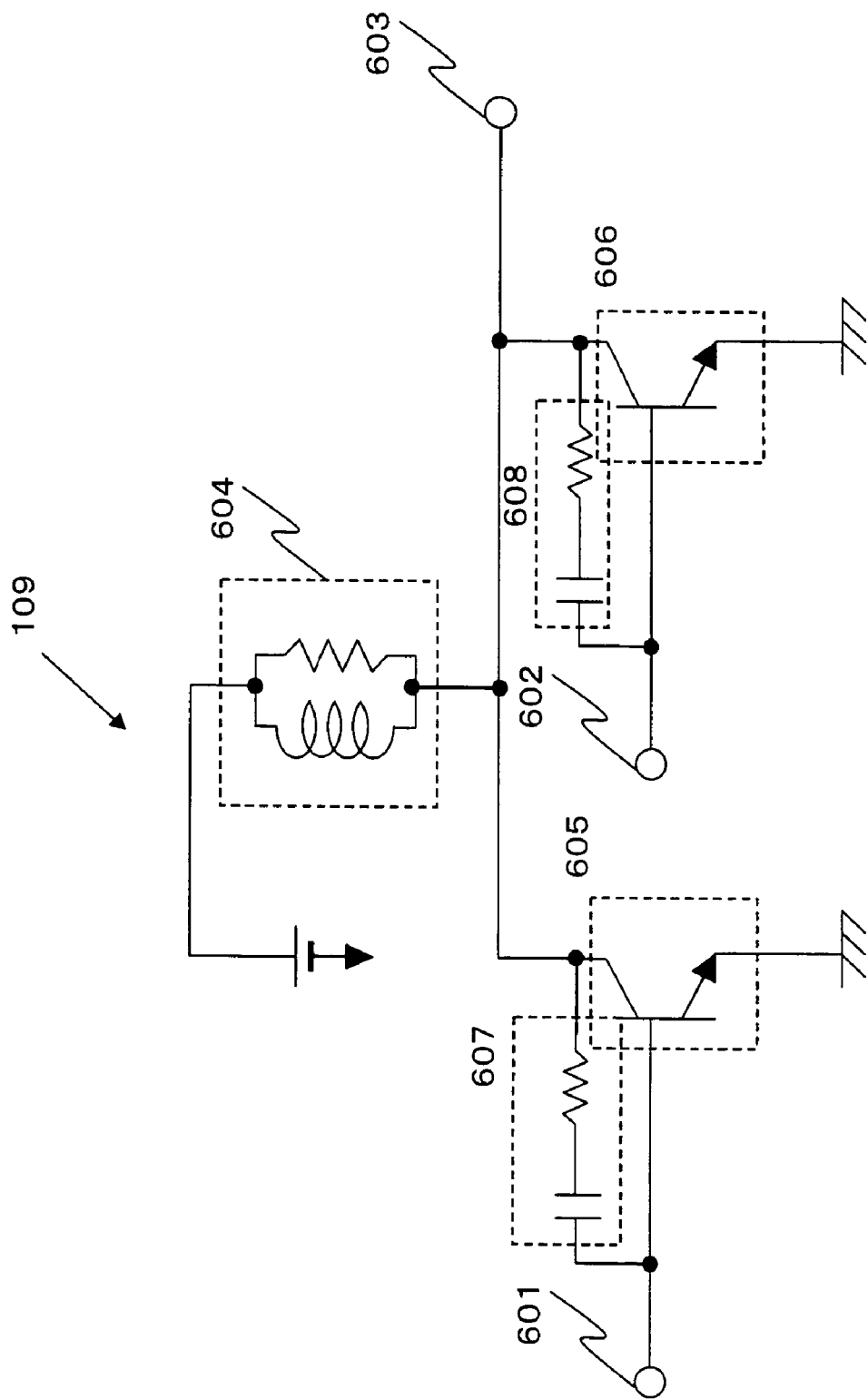
FIG. 6 is a diagram of an exemplary adder according to the first embodiment.

The adder 109, as shown in FIG. 6 for example, inputs the output amplitude component from the operational amplifier 104 (input from a terminal 601) and the output amplitude component from the frequency conversion circuit 108 (input from a terminal 602) into two grounded-emitter transistors 605 and 606, respectively. The terminals 601-603 in this figure correspond to the respective terminals in FIG. 1 of the same reference numerals. The input amplitude components are converted to the currents by each of transconductances of the transistors 605 and 606, and the currents are voltage-converted by a common load 604, thereby the added amplitude component can be obtained. In this regard, although the phase delay is generated, it can be relaxed by inserting RC feedback circuits as represented by numeral 607 and 608 between the inputs and the outputs of the transistors 605 and 606, respectively, to form the phase lead circuits.

The amplitude component output from the adder 109 is input into, for example, the DC converter 110.

The DC converter 110 is configured by, for example, an emitter follower shown in FIG. 1, wherein the output amplitude component Vbe of the adder 109 is input into a base of the emitter follower constituting the DC converter 110 and is output to the emitter with the voltage gain of approximately 1. In this regard, an emitter current Ie as in the following formula is induced in accordance with the input voltage amplitude.

$$Ie=Is\ \exp(qVbe/kT-1) \quad \text{[Formula 15]}$$

Here, k represents a Boltzmann constant, T represents an absolute temperature, q represents an elementary electric charge, Is represents a proportionality factor proportional to an emitter area.

Consequently, it is possible to derive the large DC current depending on an emitter size of the bipolar transistor used for the emitter follower constituting the DC converter 110.

Then, consider a frequency response of the voltage gain Av of the emitter follower constituting the DC converter 110. The voltage gain Av is expressed by the following formula. Here, $\omega_T$ represents the cut-off frequency of a device, $R_s$ is a source impedance, $R_E$ is a emitter load, re is an emitter resistance, and $h_{FE}$ is the voltage gain of the device.

$$Av = \frac{Avo\left(1+\frac{\omega}{\omega_T}\right)}{1+j\frac{\omega}{\omega_T}Avo\left(1+\frac{R_S}{R_E}\right)} \quad \text{[Formula 16]}$$

$$Avo = \frac{R_E}{re+R_E+\frac{R_S}{h_{FE}}}$$

The source impedance $R_s$ is the output impedance of the adder 109. By adding the emitter follower to an output buffer circuit of the adder 109 in FIG. 6, the source impedance $R_s$ can be substantially reduced. Moreover, assuming that the large current on average flows through the emitter follower constituting the DC converter 110, the emitter resistance re becomes substantially small, i.e., Avo=1. Since the load impedance $R_E$ is substantially large compared to the source impedance $R_s$, the voltage gain Av is expressed as follows.

$$Av = \frac{1 + \frac{\omega}{\omega_T}}{1 + j\frac{\omega}{\omega_T}} \quad \text{[Formula 17]}$$

It is apparent that a phase margin of the loop is increased by increasing the cut-off frequency of the transistor. Consequently, the cut-off frequency of the transistor constituting the emitter follower needs to be as high as possible. For example, the cut-off frequency $f_T$=110 GHz is required to allow the phase delay of 45 degrees. The value is fully possible to achieve by applying a hetero bipolar transistor using GaAs or SiGe. Moreover, the phase delay can be reduced, for example, by introducing the phase lead circuit such as the feedback circuit 112 or 115.

The amplitude component output from the emitter follower constituting the DC converter 110 is fed back to each of the operational amplifiers 104 and 107.

A feedback path of the operational amplifier 104 passes through the frequency selecting circuit 111 and the feedback circuit 112, while a feedback path of the operational amplifier 107 passes through the frequency selecting circuit 113, the frequency conversion circuit 114, and the feedback circuit 115.

Figure 7:
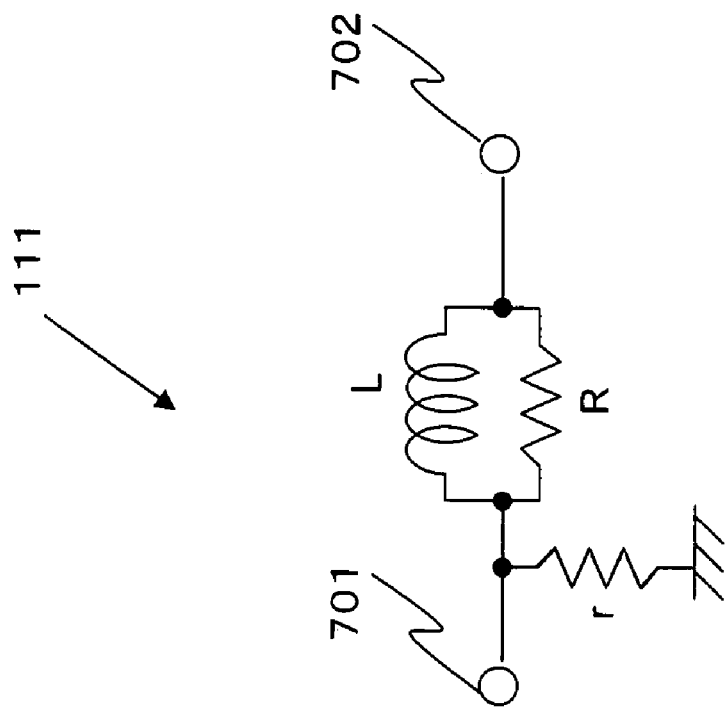
FIG. 7 is a diagram of an exemplary low-pass filter configuration according to the first embodiment.

The frequency selecting circuit 111 is the low-pass filter, configured by, for example, an inductor (L) and a resistance (R) as shown in FIG. 7. The terminals 701 and 702 in this figure correspond to the respective terminals in FIG. 1 of the same reference numerals. In this regard, the phase is expressed as follows.

$$\theta = \tan^{-1}\left(\frac{\omega rL}{rR} - \frac{\omega L(r+R)}{rR}\right) \quad \text{[Formula 18]}$$

Consequently, the low-pass filter generates the phase delay. The phase delay can be relaxed by constituting the feedback circuit 112 similar to the phase lead circuit in FIG. 1.

In this regard, the phase is expressed as follows.

$$\theta = \tan^{-1}\left(\frac{\omega rRC}{r} - \frac{\omega rRC}{r+R}\right) \quad \text{[Formula 19]}$$

The frequency selecting circuit 113 is the band-pass filter, which may be for example the low-pass filter in FIG. 7 and a high-pass filter such as the feedback circuit 112 in FIG. 1 connected in series. The phase delay equals to the addition of a phase lead of the high-pass filter and a phase lag of the low-pass filter, thereby the phase lag is relaxed.

The high-pass filter can be common with the feedback circuit 115. In this case, the frequency conversion circuit 114 and the feedback circuit 115 may be interchanged.

The frequency conversion circuit 114 frequency-convert (down-convert) the amplitude component, which is frequency selected by the frequency selection circuit 113, inversely with the frequency conversion performed by the frequency conversion circuit 108. The frequency conversion circuit 114 can take a down-conversion configuration by changing the band-pass filter 504 of the frequency conversion circuit 108 in FIG. 5 to the low-pass filter.

The feedback circuits 112 and 115 are intended to adjust the gains of the operational amplifiers 104 and 107. In practicing this embodiment, it is important to minimize the phase delay. For this purpose, the feedback circuit constituted by the phase lead circuit shown in FIG. 1 may be used. The gain of the operational amplifier 104 is determined by the gains of the feedback circuit 112 and the frequency selecting circuit 111. The gain of the operational amplifier 107 is determined by the gains of the feedback circuit 115, the frequency conversion circuit 114, and the frequency selecting circuit 113.

The amplitude component output from the emitter follower constituting the DC converter 110 is input into the power supply terminal of the high-frequency power amplifier 117. The OFDM modulating signal generated by the modulating signal generating circuit 101 is converted by the frequency conversion circuit 116 to the high-frequency signal (converted wave) multiplied by the carrier wave, which is input to the high-frequency input terminal of the high-frequency power amplifier 117.

Figure 8:
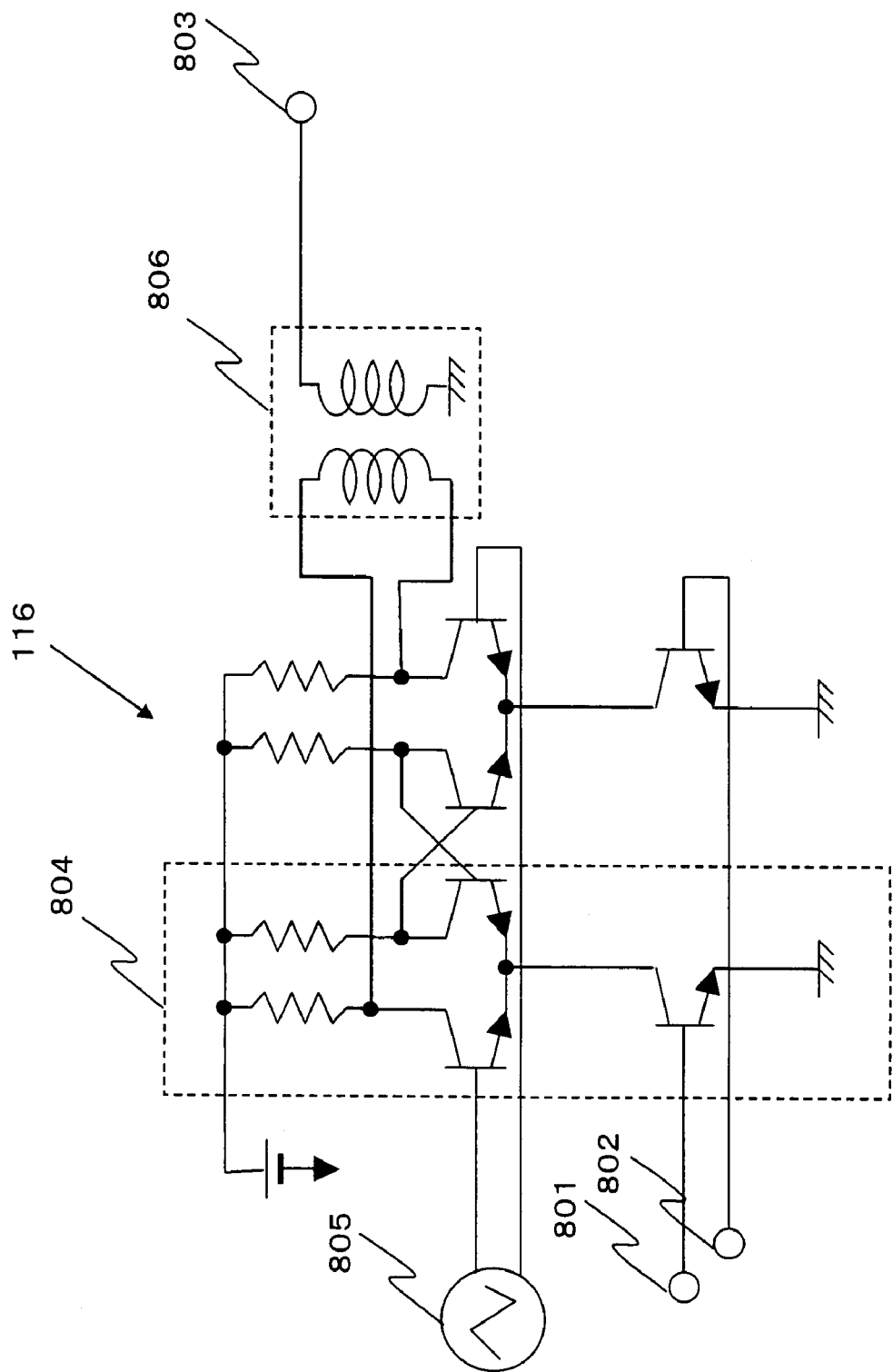
FIG. 8 is a diagram of the exemplary frequency conversion circuit 116 according to the first embodiment.

The frequency conversion circuit 116 is configured by, for example, a double-balanced mixer made up of an multiplier 804 employing the Gilbert cell as shown in FIG. 8. Terminals 801-803 in this figure correspond to the respective terminals in FIG. 1 of the same reference numerals. By applying the double-balanced mixer, leakage of the output power from the local oscillator 805 to the high-frequency power amplifier 117 can be inhibited. Moreover, since the output from the double-balanced mixer is differential, it includes a balun 806 to transform the output into single-phase. The spurious component other than a harmonic component is not contained because the frequency of the local oscillator 805 and the carrier wave frequency are identical.

The high-frequency power amplifier 117 is a saturation type, wherein the input modulated wave is saturated at least at the final stage of the high-frequency power amplifier 117. The saturated modulated wave is a constant envelope signal without the amplitude component, which is not different to use the phase component in the conventional EER method. It is described that the configuration of this embodiment operates in similar way to that of the conventional EER method by reference to the drawings.

Figure 9A:
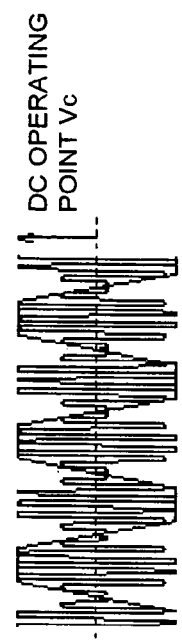
FIGS. 9A, 9B, 9C, and 9D are diagrams illustrating a circuit operation performing an approximate EER method utilizing a constant envelope domain.
Figure 9B:
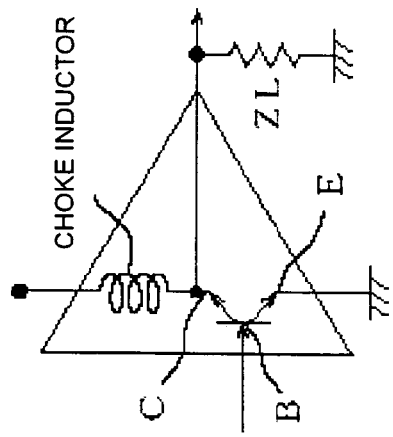

For simplicity of the description, an input wave (an OFDM wave in this embodiment) into the high-frequency power amplifier 117 is defined as a triangular wave as shown in FIG. 9A where an envelope of the amplitude forms a triangle. FIG. 9B shows an internal configuration of the high-frequency power amplifier. The high-frequency power amplifier in this embodiment is the grounded-emitter bipolar transistor, and the OFDM modulating signal as the modulating signal in this embodiment is input into the base (high-frequency input terminal) of the bipolar transistor. Moreover, a choke inductor is inserted between the collector (power supply voltage terminal) and a collector voltage Vc supply side of the bipolar transistor, and a wiring interconnecting the collector and the high-frequency output terminal is connected to the ground via an output load ZL. The configuration can be equivalently illustrated by such a circuit.

Figure 9C:
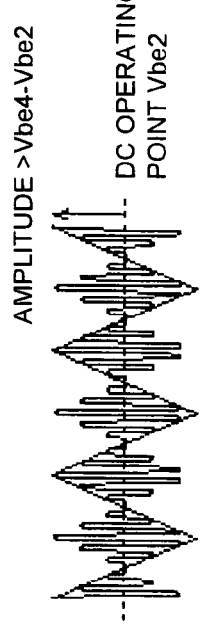
Figure 9D:
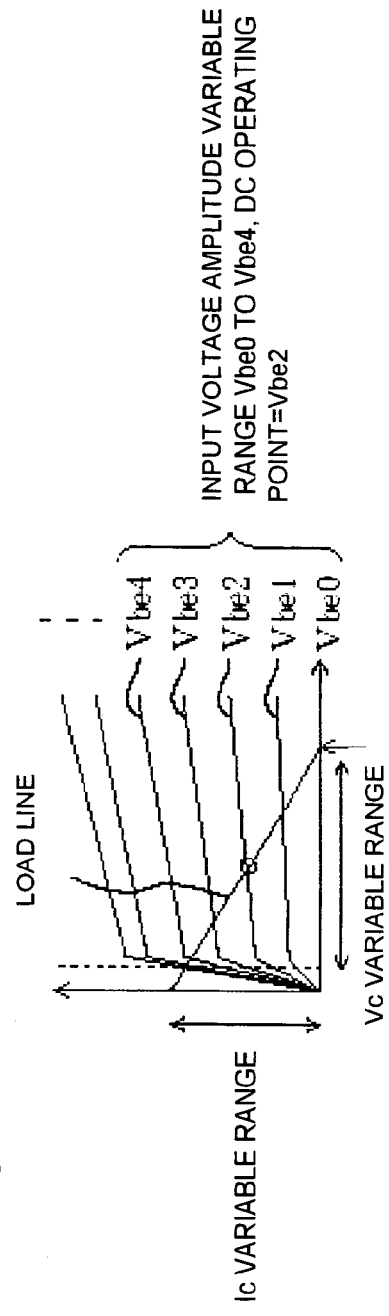

FIG. 9D is a diagram illustrating an input/output characteristic of the high-frequency power amplifier, wherein a vertical axis represents a collector current Ic of the high-frequency power amplifier and a horizontal axis represents a collector voltage Vc applied to the power supply voltage terminal of the high-frequency power amplifier. In FIG. 9D, it is shown that the Ic-Vc characteristic varies depending on the base-emitter voltage Vbe of the high-frequency power amplifier, and that a load line defined by a DC base-emitter voltage Vbe, a DC collector voltage Vc and the output load ZL of the high-frequency power amplifier determines a variable range of the base-emitter voltage Vbe, as well as variable ranges of the collector current Ic and the collector voltage Vc.

FIG. 9C shows the resulting output voltage output from the high-frequency output terminal of the high-frequency power amplifier, wherein the output voltage and the output impedance ZL determines the output power.

Here, when the input voltage exceeds the variable range (Vbe4-Vbe0 in FIG. 9D) of the base-emitter voltage Vbe, the collector current exceeds the variable range of the collector current Ic determined by the load line. Hence, it generates a time domain where the current amplitude stays constant (constant envelope). Since the voltage amplitude is obtained from the collector current Ic being voltage-converted by the load impedance ZL of the output, a constant (constant envelope) time domain is also generated for the voltage amplitude Vout (=Ic·ZL). Since the signal having a constant envelope domain is substantially equivalent to the phase component, the operation to be performed is similar in function to that of the EER where the phase component and the amplitude component are respectively input into the high-frequency input terminal and the power supply voltage terminal of the high-frequency power amplifier. Thus, the operation is herein referred to as an approximate EER method.

According to this embodiment, the requirements for the GBW of the operational amplifiers 104 and 107 can be relaxed by dividing the band of the amplitude component separated from the broadband modulating signal. Moreover, the sampling frequency for the D/A converter built in, for example, the frequency selecting circuit 103 or the frequency conversion circuit 106 can be reduced, resulting in reduction in the power consumption of the D/A converter. Consequently, the circuit can be applied for the broadband signal, which has been difficult to process by the conventional EER method, enabling the transmitter circuit to be highly efficient using the EER method for the broadband modulating signal.

While, in the conventional EER method, the phase component of the modulating signal is applied to the high-frequency input terminal of the high-frequency power amplifier, it is required to increase the sampling frequency of the D/A converter upon D/A conversion of a phase signal due to the phase component of the broadband signal expanding to more than 5 times of the initial modulation band as well as the amplitude component thereof, resulting in the disadvantage in terms of the power consumption. Moreover, the signal is not the constant envelope signal because it lacks the phase component having the high frequency by the band limitation being applied. That is, while the signal moves with a certain angular velocity in a symbol map having a constant envelope property before applying the band limitation, the angular velocity is limited by applying the band limitation. Consequently, it becomes impossible for the signal to move a distance between symbol points where it should inherently move therebetween, and instead the signal samples a straight line connecting the symbol points. Thus, it is not the constant envelope signal and it contains a phase error at this point. Furthermore, by saturating the modulated wave without the constant envelope property using the high-frequency power amplifier, the gain of the signal containing the error increases.

Hence, the influence by the symbol points becomes measurable, which has been negligible regardless of the presence of the error because the amplitude was small, resulting in the modulation accuracy being substantially decreased. By inputting the IQ signal into the high-frequency input terminal of the high-frequency power amplifier as described in the configuration of this embodiment, the band of the signal to be processed can stay the same as that of the initial modulating signal. Hence, the sampling frequency for the D/A converter built in, for example, the modulating signal generating circuit 101 can be reduced, the need of filtering before D/A conversion can be eliminated, and the modulating signal is not deteriorated by D/A conversion. Additionally, since the band of the high-frequency power amplifier is generally several hundreds MHz and is not limited, the saturated signal from the high-frequency power amplifier is the complete constant envelope signal without lack, as long as the high-frequency power amplifier is the complete saturation type power amplifier. However, while the high-frequency power amplifier cannot be the saturation type power amplifier, especially when the low power supply voltage is provided, the signal cannot be the constant envelope signal at low amplitude. In this case, the amplitude component and the saturated modulating signal are multiplied with each other at the output side of the high-frequency power amplifier, square-law characteristic of the amplitude is obtained at the low amplitude side. It results in the need for distortion compensation. The distortion compensation is achieved by, for example, inputting the modulating signals having an identical form into the high-frequency terminal and the power supply terminal of the high-frequency power amplifier, estimating a function of the distortion characteristic of the high-frequency power amplifier based on the modulating signal output from the high-frequency amplifier, and applying an inverse function thereof to the initial modulating signal. It can be configured that the resulting signal is output from the modulating signal generating circuit 101.

Second Embodiment

Figure 10:
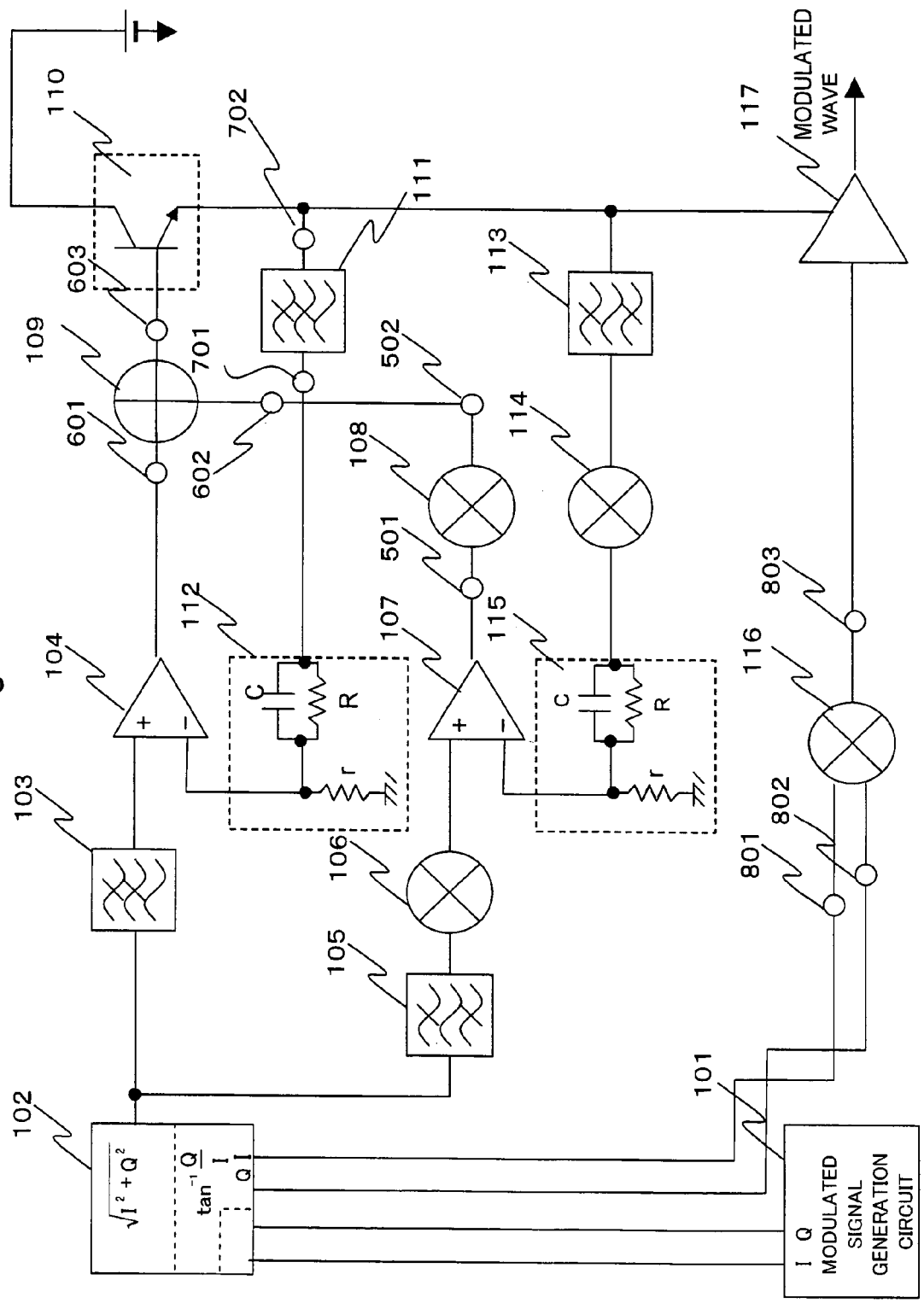
FIG. 10 is a block circuit diagram of a transmitter circuit according to a second embodiment.

The second embodiment of the present invention will be described by reference to FIG. 10.

This embodiment is different from the first embodiment that the phase component detected by the detection circuit 102 is input as the modulating signal into the frequency conversion circuit 116.

Other configurations, as well as their effects and operations, are same as those of the first embodiment, so that the description thereof will be omitted here. The effects obtained by the configuration of this embodiment are as follows. In the first embodiment, when the first frequency conversion means 116 and the high-frequency power amplifier 117 are internally configured by multistage circuits, the back off operation is required for a block or an amplifier stage not involving the saturation operation. The back off operation decreases the efficiency of such block or amplifier stage. However, since the complete constant envelope signal is input in this embodiment, the back off operation is not required, allowing the block or the amplifier stage to operate in high efficiency.

Third Embodiment

The third embodiment of the present invention will be described by reference to FIG. 11.

Figure 11:
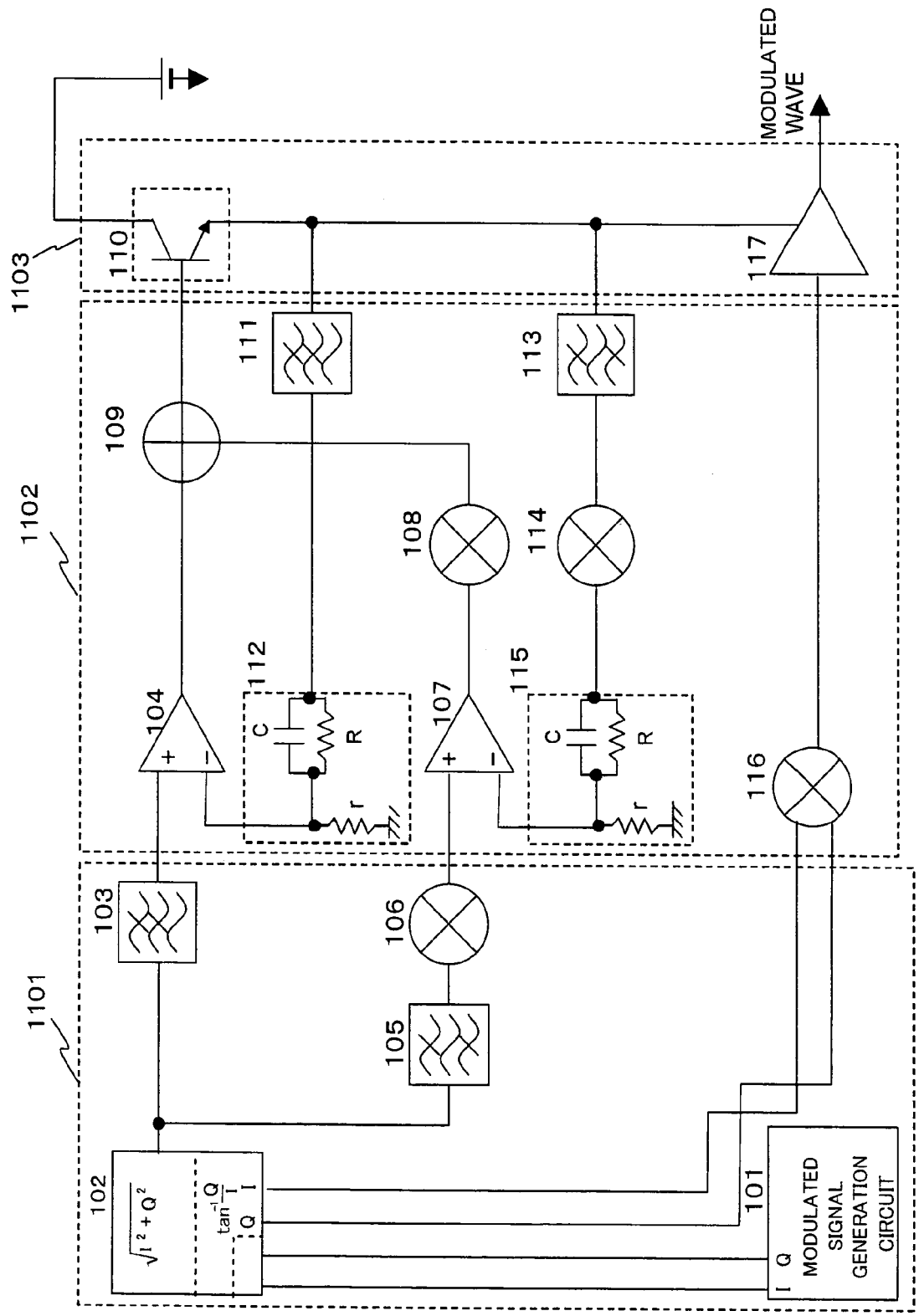
FIG. 11 is a block circuit diagram of a third embodiment (where the first embodiment is integrated)

FIG. 11 shows a configuration of the third embodiment.

FIG. 11 shows the configuration which, in the case that the configuration of the first embodiment is implemented using a plurality of integrated circuits, should be included in the respective integrated circuits. The transmitter circuit is configured by three integrated circuits 1101, 1102, and 1103.

The integrated circuit 1101 integrates the modulating signal generating circuit 101, the detection circuit 102, the frequency selecting circuit 103 and 105, and the frequency conversion circuit 106.

The integrated circuit 1102 integrates the operational amplifiers 104 and 107, the adder 109, the frequency selecting circuits 111 and 113, the frequency conversion circuits 116, 114 and 108, and the feedback circuits 112 and 115.

The integrated circuit 1103 integrates the high-frequency power amplifier 117 and the DC conversion means 110.

With the foregoing configuration, the integrated circuit 1101 can be fabricated using a digital CMOS process for microfabrication suitable for processing a digital signal, so that the circuit can be miniaturized by the CMOS process and the power consumption and the chip area can be reduced as well.

The integrated circuit 1102 can be fabricated using a high integration process, such as an analog CMOS process or a BiCMOS process, suitable for an analog circuit. The CMOS process or a bipolar process optimized for analog fabrication is superior to the digital CMOS process specialized for microfabrication in terms of high power characteristics, such as a withstanding voltage, and the resulting circuit can process the analog signal with the large amplitude as described in the embodiment. The bipolar process has excellent high-frequency characteristics, allowing the frequency conversion circuit 116 to up-convert the modulating signal into a GHz band. Moreover, since it is possible to incorporate a logic circuit into the frequency conversion circuit 116, Phase Locked Loop (PLL) or the like can be integrated.

Since the integrated circuit 1103 integrates a block required to satisfy the high-frequency characteristics and the high power characteristics altogether, which is generally difficult to be achieved using the analog CMOS process or the bipolar process, the block cannot be incorporated into the integrated circuit 1102. However, by configuring the integrated circuit of a compound semiconductor, such as GaAs, the transistor can be achieved with the cut-off frequency or the maximum oscillating frequency over 100 GHz and a certain amount of withstanding voltage. Thus, it is possible to achieve the high-frequency power amplifier or the DC converter requiring the high-frequency characteristics as well as the high power characteristics.

Fourth Embodiment

The fourth embodiment according to the first and third invention will be described by reference to FIG. 12.

This embodiment employs the OFDM modulating signal as with the first embodiment. The detailed description regarding the signal overlaps with that of the first embodiment, so that it will be omitted here.

Figure 12:
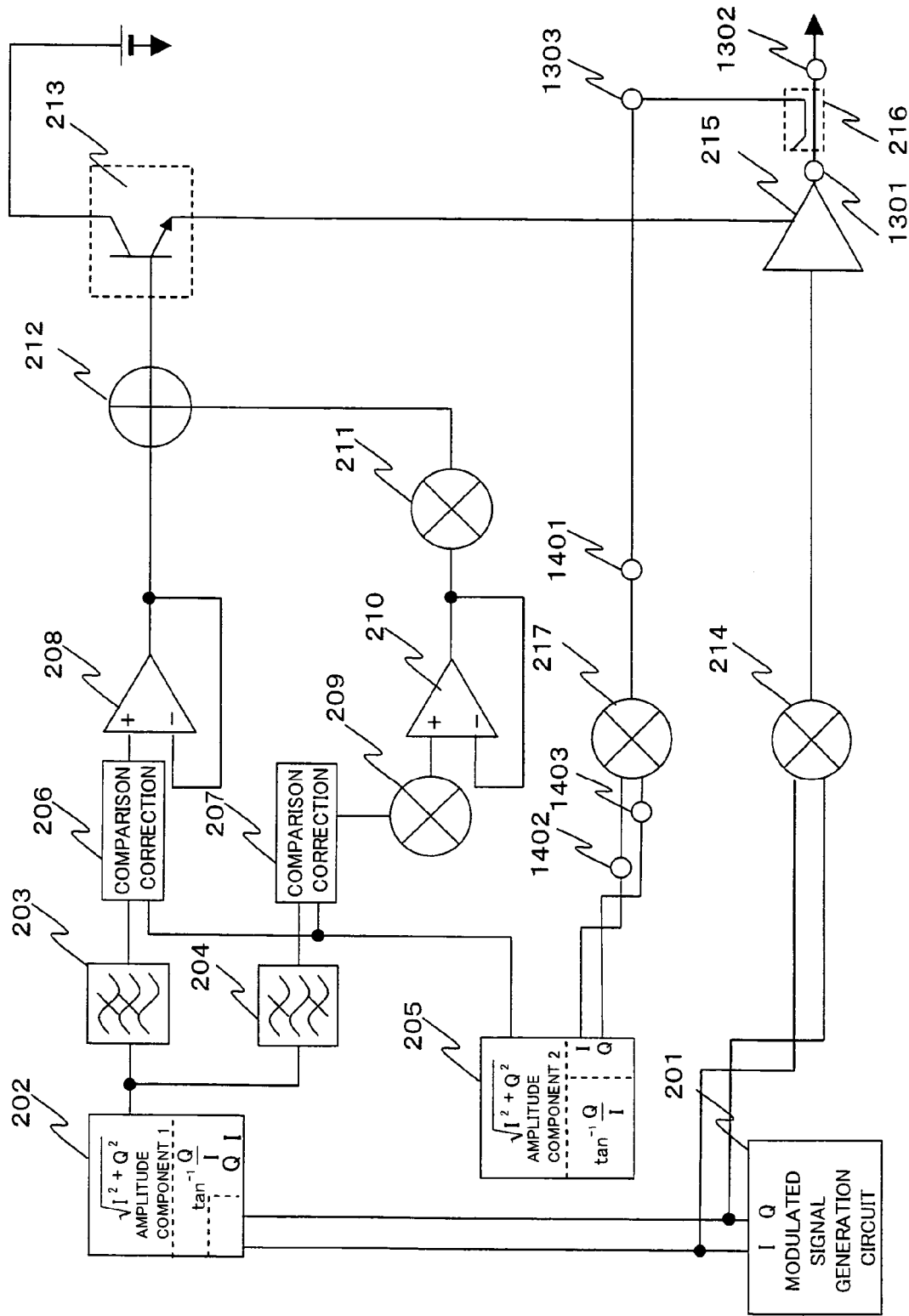
FIG. 12 is a block circuit diagram of a transmitter circuit according to a fourth embodiment.

FIG. 12 is a block circuit diagram of the transmitter circuit for implementing the EER method according to the fourth embodiment of the present invention. The transmitter circuit is configured by, as shown in this figure, a modulating signal generating circuit 201 for generating the OFDM modulating signal containing the amplitude component and the phase component, a detection circuit 202 for detecting the amplitude component of the OFDM modulating signal generated by the modulating signal generating circuit 201, a frequency selecting circuit 203 for frequency selecting the amplitude component detected by the detection circuit 202, a frequency selecting circuit 204 for frequency selecting the amplitude component detected by the detection circuit 202, a detection circuit 205, a comparison correction circuit 206 for comparing the amplitude component detected by the detection circuit 205 with the amplitude component from the frequency selecting circuit 203 to output the corrected amplitude component based on the result, a comparison correction circuit 207 for comparing the amplitude component detected by the detection circuit 205 with the amplitude component from the frequency selecting circuit 204 to output the corrected amplitude component based on the result, an amplifier 208 for amplifying the amplitude component output from the comparison correction circuit 206, a frequency conversion circuit 209 for frequency-converting the amplitude component output from the comparison correction circuit 207, an amplifier 210 for amplifying the amplitude component frequency-converted by the frequency conversion circuit 209, a frequency conversion circuit 211 for frequency-converting the amplitude component amplified by the amplifier 210, an adder 212 for adding up the amplitude components from the amplifier 208 and from the frequency conversion circuit 211, a DC converter 213 for DC converting the amplitude component added up by the adder 212, a frequency conversion circuit 214 for frequency-converting the modulating signal from the modulating signal generating circuit 201, a high-frequency power amplifier 215 for inputting the modulated wave from the frequency conversion circuit 214 and the amplitude component from the DC converter 213 into the high-frequency input terminal and the power supply terminal, respectively, and for outputting the product of the modulated wave obtained by amplifying the above modulated wave and the above amplitude component, a feedback circuit 216 for partially feeding back the output power from the high-frequency power amplifier 215, and a frequency conversion circuit 217 for frequency-converting the output power from the high-frequency power amplifier 215 fed back from the feedback circuit 216. The above detection circuit 205 detects the amplitude component from the output signal of the frequency conversion circuit 217.

The operations of the modulating signal generating circuit 201, the detection circuit 202, the frequency conversion circuit 214, the adder 212, the high-frequency power amplifier 215 and the DC converter 213 are identical to those of the modulating signal generating circuit 101, the detection circuit 102, the frequency conversion circuit 116, the high-frequency power amplifier 117 and the DC converter 110, respectively, so that the descriptions thereof will be omitted here.

Here, the modulating signal generating circuit 201 corresponds to modulating signal generating means. The detection circuit 202 corresponds to first modulating signal detecting means. The detection circuit 205 corresponds to second modulating signal detecting means. The frequency selecting circuit 203 corresponds to first frequency selecting means. The frequency selecting circuit 204 corresponds to second frequency selecting means. The comparison correction circuit 206 corresponds to first comparison correction means. The comparison correction circuit 207 corresponds to second comparison correction means. The amplifier 208 corresponds to first amplification means. The amplifier 210 corresponds to second amplification means. The adder 212 corresponds to adding means. The DC converter 213 corresponds to DC conversion means. The frequency conversion circuit 214 corresponds to first frequency conversion means. The frequency conversion circuit 217 corresponds to second frequency conversion means. The frequency conversion circuit 209 corresponds to third frequency conversion means. The frequency conversion circuit 211 corresponds to fourth frequency conversion means. The feedback circuit 216 corresponds to feedback means.

Figure 13:
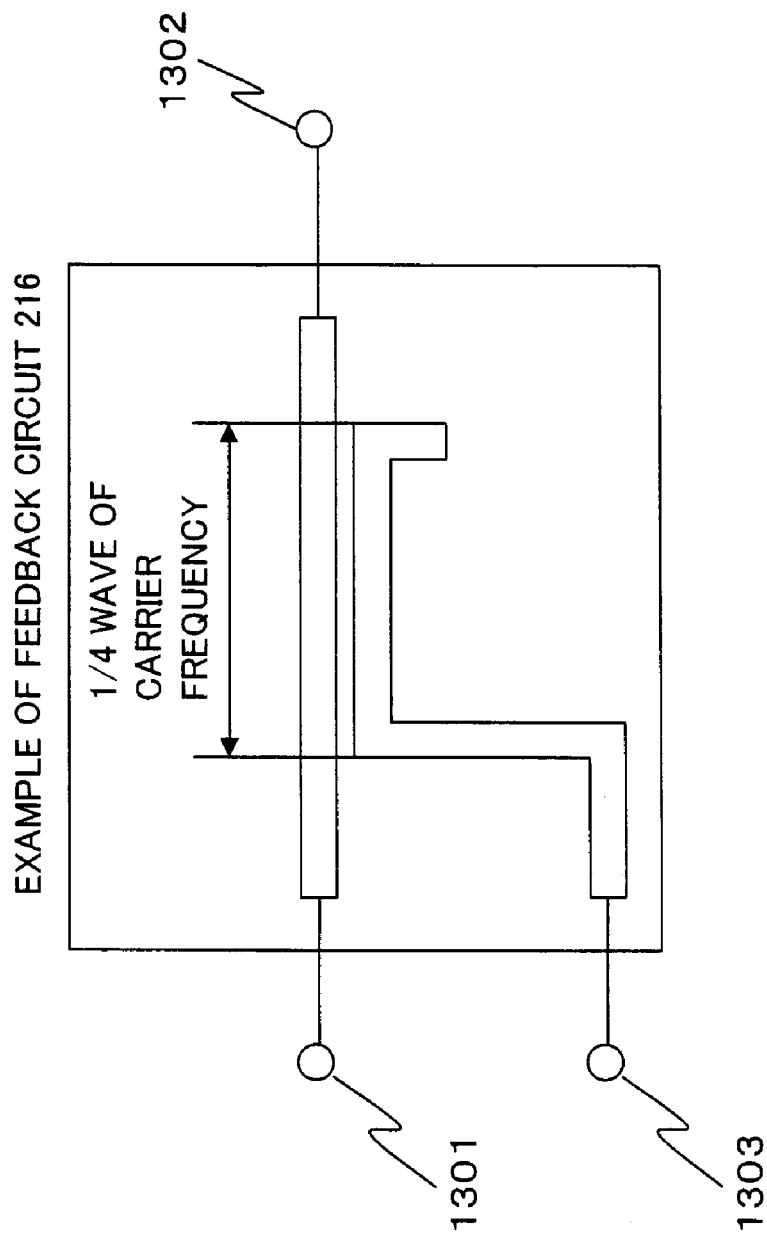
FIG. 13 is a diagram of an exemplary feedback circuit according to the fourth embodiment.
Figure 14:
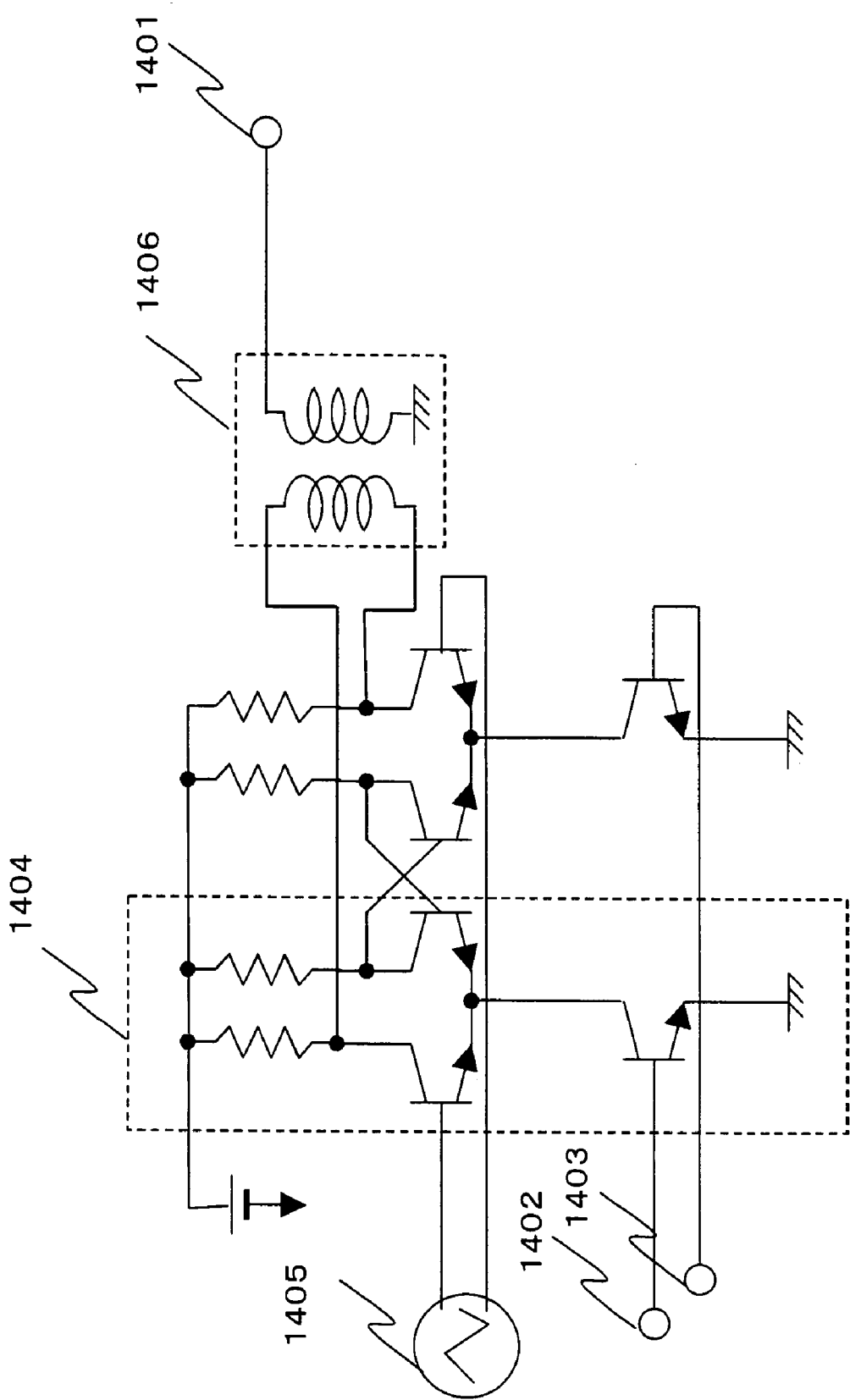
FIG. 14 is a circuit diagram illustrating a configuration of a frequency conversion circuit 217 according to the fourth embodiment.

The power output from the high-frequency power amplifier 215 is partially fed back by the feedback circuit 216. For example, assuming that the transmission line of the output of the high-frequency power amplifier 215 is a microstrip line, the feedback circuit 216 is configured by disposing the microstrip line having a ¼ wavelength of the carrier wave frequency parallel and in proximity to the transmission line (microstrip line) where the signal passes therethrough (refer to FIG. 13). Terminals 1301-1303 in this figure correspond to the respective terminals in FIG. 12 of the same reference numerals. Since the degree of coupling between the ¼ wavelength microstrip line and the signal line is expressed as a function of the distance and the line width (line characteristic impedance), the feedback amount can be determined by adjusting it. The frequency conversion circuit 217 for receiving the input of the fed-back power needs to operate linearly operates. Hence, as shown in FIG. 14, it is necessary to attenuate the power input into an active circuit or to increase the amount of current flowing through the active circuit, so that the active circuit (for example, a Gilbert cell 1404) in the frequency conversion circuit 217 operates sufficiently linearly.

The frequency conversion circuit (mixer) 217 down-converts the modulated wave power of the high-frequency power amplifier 215 fed back by the feedback circuit 216 linearly to the signal (baseband signal) having the same frequency with that output from the modulating signal generating circuit 201. The terminals in this figure correspond to the respective terminals in FIG. 12 of the same reference numerals. The method for down conversion includes a super heterodyne method, which requires the plurality of local oscillators in the frequency conversion circuit and the plurality of filters for removing the spurious component, or a direct conversion method, which utilizes one local oscillator and does not generate the spurious component. In this embodiment, the direct conversion method is employed. The direct conversion method is for down-converting the input signal to the baseband signal directly by providing a local oscillator 1405, as shown in FIG. 14, so as to generate the same frequency with the carrier wave frequency by the local oscillator 1405. Since the DC component in this method is generated from an in-phase component containing a secondary distortion of the multiplier, it is preferable to use the differential multiplier (Gilbert cell 1404) superior in in-phase component removal performance, as well as the double-balanced multiplier (mixer) to prevent the power of the local oscillator 1405 leaking to the feedback circuit. The double-balanced mixer may be, for example, the double-balanced mixer using the Gilbert cell shown in FIG. 14. The input requires being differential for the double-balanced mixer, which needs to be provided with a balun 1406 as the converter to transform the single-phase to/from the differential components.

The output signal from the frequency conversion circuit 217 is A/D converted by the detection circuit 205 so that the amplitude component is detected by the same method with that of the detection circuit 202. Here, the A/D converter may be included either in the detection circuit 205 or in the frequency conversion circuit 217. The description regarding the detection method overlaps with that of the first embodiment, so that it will be omitted here.

The frequency selecting circuits 203 and 204 utilize, for example, the ideal rectangular 400-tap FIR filters, so that the amplitude component, detected by the detection circuit 202, divided into the signals ranging from DC to 25 MHz and from 25 MHz to 50 MHz pass therethrough, respectively. The comparison correction circuit 206 compares the amplitude component (1) detected by the detection circuit 205 with the amplitude component (2) selected by the frequency selecting circuit 203 to output the corrected amplitude component. In this regard, it is necessary that the two amplitude components are synchronous. Synchronization may be achieved by, within a preamble signal period (short training signal output within a initial 16 μsec period, in accordance with the IEEE 802.11a standard) for example, performing a convolution computation for the amplitude components (1) and (2) to time shift the phase-lagged signal by the delay amount where the computed value (correlation value) is maximum. After synchronization, the amplitude component (1) output from the detection circuit 202 and the amplitude component (2) output from the detection circuit 205 are compared with each other to correct the linear distortion (disturbance in the frequency response due to the group delay) and the non-linear distortion (disturbance in the amplitude response due to the non-linearity of the conductance of the active element) of the block where the linear operation is not expected, i.e., the amplifier 208, the adder 212, the DC converter 213 and the high-frequency power amplifier 215, in a first closed loop of the comparison correction circuit 206, the amplifier 208, the adder 212, the DC converter 213, the high-frequency power amplifier 215, the feedback circuit 216, the frequency conversion circuit 217 and the detection circuit 205. The correction is performed using the preamble signal, for example. It is required to determine a transfer function of the loop for performing the correction. Here, assuming that the output signal from the frequency selecting circuit 203 of the preamble signal is S1, the amplitude component S1$d$ detected by the detection circuit 205 can be expressed as S1$d$=H1S1. Both S1 and S1$d$ are given signals, so that the transfer function H1 of a second closed loop is estimated. Upon determination, a switch of the comparison correction circuit 207 is used for preventing the signal to output from the comparison correction circuit 207. By estimating the transfer function H1, an inverse function thereof H1$^{-1}$ can be obtained. Thus, the comparison correction circuit 205 outputs the corrected amplitude component H1$^{-1}$S1.

The comparison correction circuit 207 compares the amplitude component (1) detected by the detection circuit 205 with the amplitude component (3) selected by the frequency selecting circuit 204 to output the corrected amplitude component. The amplitude components (1) and (3) are synchronized as with the comparison correction circuit 206. After synchronization, the amplitude component output from the detection circuit 202 and the amplitude component output from the detection circuit 205 are compared with each other to correct the linear distortion and the non-linear distortion of the block where the linear operation is not expected, i.e., the amplifier 210, the frequency conversion circuit 211, the adder 212, the DC converter 213 and the high-frequency power amplifier 215, in the second closed loop of the comparison correction circuit 207, the frequency conversion circuit 209, the amplifier 210, the frequency conversion circuit 211, the adder 212, the DC converter 213, the high-frequency power amplifier 215, the feedback circuit 216, the frequency conversion circuit 217 and the detection circuit 205. The correction method is similar to that of the comparison correction circuit 203, so that the description will be omitted here. Upon determination, a switch of the comparison correction circuit 206 is used for preventing the signal to output from the comparison correction circuit 206. As a result, the amplitude component H2$^{-1}$S2, obtained from the transfer function H2 of the second closed loop and the output signal S2 from the frequency selecting circuit 204, is output from the comparison correction circuit 207.

As described above, the linear output can be obtained from the high-frequency power amplifier 215 by correcting the amplitude component.

The frequency conversion circuit 209 down-converts the amplitude component from the comparison correction circuit 207 to the signal ranging from DC to 25 MHz by means of a frequency shift.

The amplifiers 208 and 210 amplify the D/A converted amplitude components from the comparison correction circuit 206 and the frequency conversion circuit 209, respectively, by the required amount. In this embodiment, the voltage follower having the gain of 1 is configured using the operational amplifier. The D/A converter may be included either in the amplifier 208 or in the comparison correction circuit 206 similarly, the D/A converter may be included either in the amplifier 210 or in the comparison correction circuit 209.

The frequency conversion circuit 211 frequency-converts the amplitude component from the amplifier 210 to be restored to the frequency band, which is that before being frequency-converted by the frequency conversion circuit 209. The method is similarly configured with that applied by the frequency conversion circuit 108 of the first embodiment, so that the description thereof will be omitted here.

According to this embodiment, the requirements for the GBW of the amplifiers 208 and 210 can be relaxed by dividing the band of the amplitude component separated from the broadband modulating signal. Moreover, the sampling frequency for the D/A converter between the comparison correction circuit 206 and the amplifier 208 (the converter may be built in either 206 or 208), resulting in reduction in the power consumption of the D/A converter. Consequently, the circuit can be readily applied for the broadband signal, which has been difficult to process by the conventional EER method, enabling the transmitter circuit to be highly efficient using the EER method for the broadband modulating signal.

While, in the conventional EER method, the phase component of the modulating signal is applied to the high-frequency input terminal of the high-frequency power amplifier, it is required to increase the sampling frequency of the D/A converter upon D/A conversion of the phase signal due to the phase component of the broadband signal expanding to more than 5 times of the initial modulation band as well as the amplitude component thereof, resulting in the disadvantage in terms of the power consumption. Moreover, the signal is not the constant envelope signal because it lacks the phase component having the high frequency by the band limitation being applied. That is, while the signal moves with a certain angular velocity in the symbol map having the constant envelope property before applying the band limitation, the angular velocity is limited by applying the band limitation. As a result of that, it becomes impossible for the signal to move a distance between symbol points where it should inherently move therebetween, and instead the signal samples a straight line connecting the symbol points. Thus, it is not the constant envelope signal and it contains the phase error at this point. Furthermore, by saturating the modulated wave without the constant envelope property using the high-frequency power amplifier, the gain of the signal containing the error increases. Furthermore, the influence by the symbol points becomes measurable, which has been negligible regardless of the presence of the error because the amplitude was small, resulting in the modulation accuracy being substantially decreased. By inputting the IQ signal into the high-frequency input terminal of the high-frequency power amplifier as described in the configuration of this embodiment, the band of the signal to be processed can stay the same as that of the initial modulating signal. Like the configuration of this embodiment, the sampling frequency for the D/A converter can be reduced, the need of filtering before D/A conversion can be eliminated, and the modulating signal is not deteriorated by D/A conversion.

Additionally, since the band of the high-frequency power amplifier is generally several hundreds MHz and is not limited, the saturated signal from the high-frequency power amplifier is the complete constant envelope signal without lack, as long as the high-frequency power amplifier is the complete saturation type amplifier. However, while the high-frequency power amplifier cannot be the saturation type amplifier, especially when the low power supply voltage is provided, the signal cannot be the constant envelope signal at the low amplitude. In this case, the amplitude component and the saturated modulating signal are multiplied with each other at the output side of the high-frequency power amplifier, the square-law characteristic of the amplitude is obtained at the low amplitude side. However, according to this embodiment, it does not cause a problem because the characteristic is corrected as well by the comparison correction circuits 206 and 207 as the non-linear distortion of the high-frequency power amplifier.

Fifth Embodiment

The fifth embodiment of the present invention will be described by reference to the drawings.

Figure 15:
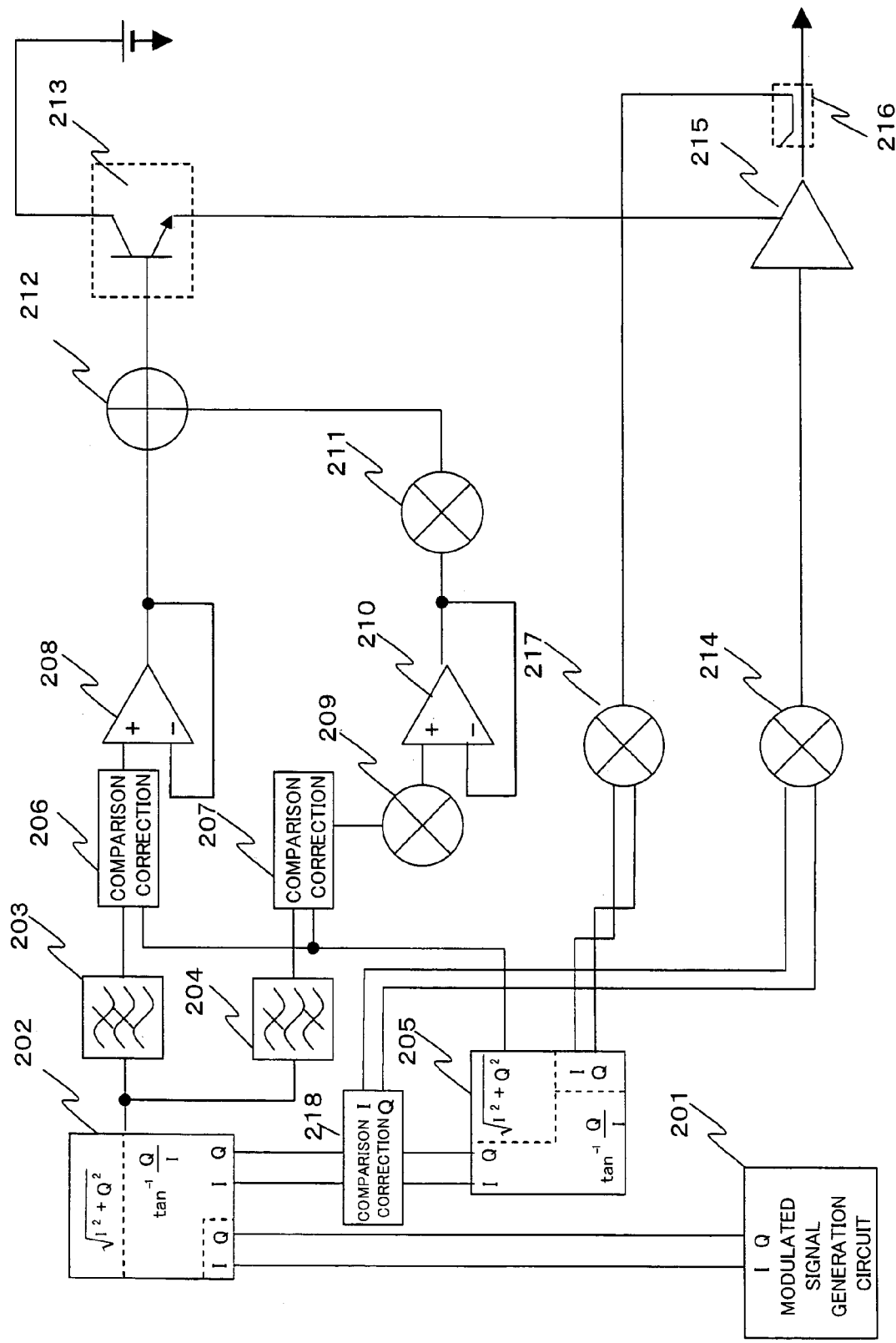
FIG. 15 is a block circuit diagram of a transmitter circuit according to a fifth embodiment.

FIG. 15 is a block diagram illustrating a configuration of the fifth embodiment. What is different from the fourth embodiment is that the detection circuits 202 and 205 detect the phase component as well as the amplitude component. Moreover, the phase component detected by the detection circuit 202 is compared with the phase component detected by the detection circuit 205, and the correction is provided to the phase component based on the comparison result. The detection method of the phase component is described in the first embodiment, so that the description will be omitted here.

Assuming that S is the phase component of the preamble signal detected by the detection circuit 202, and H is the transfer function of the closed loop formed of the comparison correction circuit 218, the frequency conversion circuit 214, the high-frequency power amplifier 215, the feedback circuit 216, the frequency conversion circuit 217, and the detection circuit 205, the signal output from the detection circuit 205 is Sd=Hs. For measuring the transfer function, both of the switches of the comparison correction circuits 206 and 207 are turned on because the high-frequency power amplifier 215 generating the phase distortion, which is the function of the amplitude, needs to be provided with the amplitude component. Hence, it is desirable that the transfer function is of the kind, which receives the amplitude given to the power supply terminal of the high-frequency power amplifier 215 as the input and outputs the amount of phase distortion. By this, the amount of phase distortion for the amplitude component can be provided.

The operations of the other blocks are similar to those of the fourth embodiment, so that the description thereof will be omitted here.

According to the configuration of this embodiment, performing the correction of the phase component enables to correct the distortion when the high-frequency power amplifier 215 generates the AM-PM distortion (input amplitude level to output phase rotation amount) of the phase component, allowing the linearity of the output signal from the high-frequency power amplifier being increased. In the fourth embodiment, when the frequency conversion circuit 214 and the high-frequency power amplifier 215 are internally configured by multistage circuits, the back off operation has been required for the block or the amplifier stage not involving the saturation operation. The back off operation decreases the efficiency of such block or amplifier stage. However, since the complete constant envelope signal is input in this embodiment, the back off operation is not required, allowing the block to operate in high efficiency.

Sixth Embodiment

Figure 16:
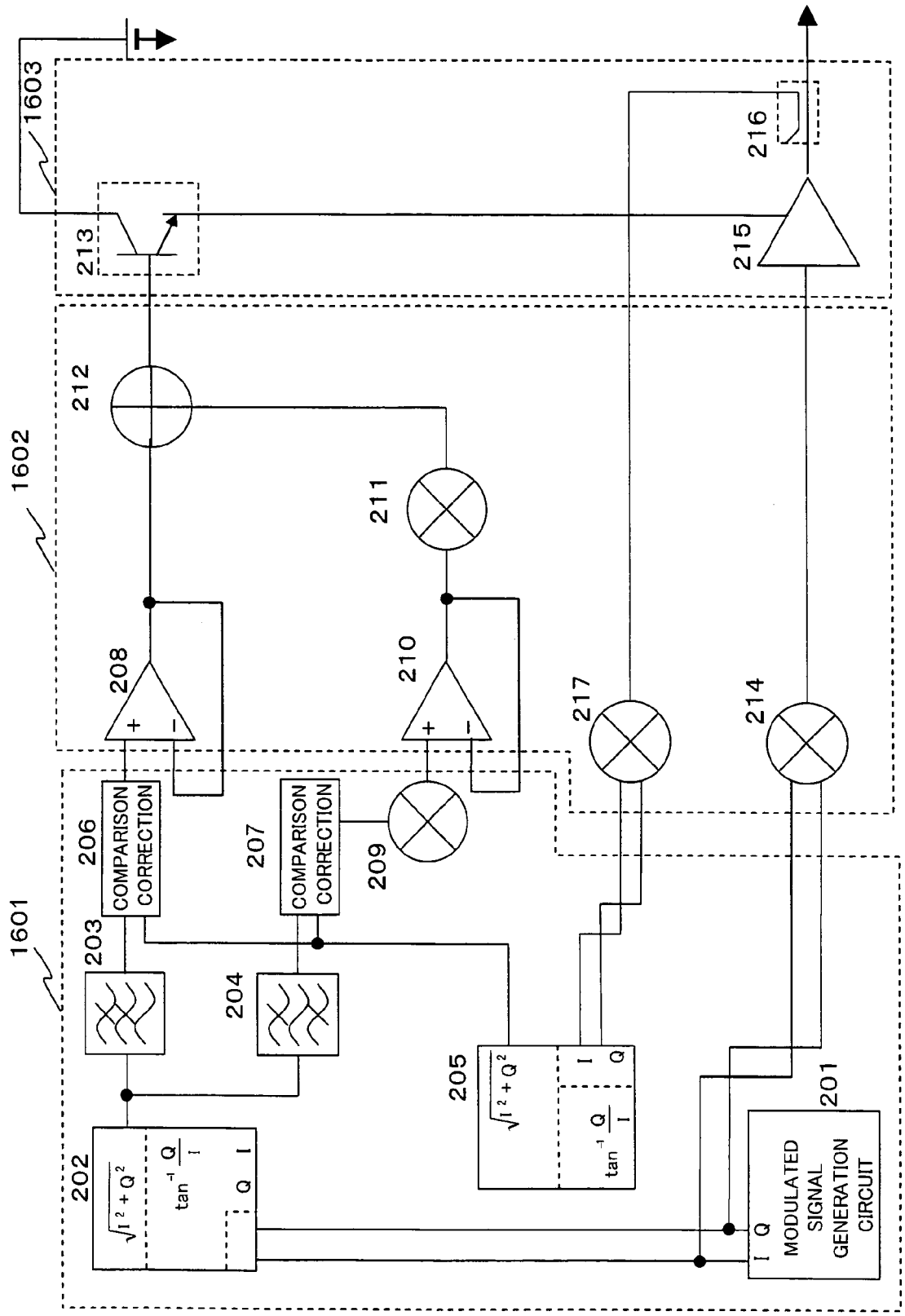
FIG. 16 is a block circuit diagram of a sixth embodiment (where the fourth embodiment is integrated)

The sixth embodiment of the present invention will be described by reference to the drawings. FIG. 16 is a diagram illustrating a configuration of the sixth embodiment of the present invention.

The sixth embodiment shows the configuration which, in the case that the configuration of the fourth embodiment is implemented using the integrated circuits, should be included in the respective integrated circuits.

The transmitter circuit is configured by three integrated circuits 1601, 1602, and 1603. The integrated circuit 1601 integrates the modulating signal generating circuit 201, the detection circuits 202 and 205, the frequency selecting circuits 203 and 204, the comparison correction circuits 206 and 207, and the frequency conversion circuit 209.

The integrated circuit 1602 integrates the amplifiers 208 and 210, the adder 212, and the frequency conversion circuits 214, 217 and 211.

The integrated circuit 1603 integrates the high-frequency power amplifier 215, the DC converter 213, and the feedback circuit 215.

With the foregoing configuration, the integrated circuit 1601 can be fabricated using the digital CMOS process for microfabrication suitable for processing the digital signal, so that the circuit can be miniaturized by the CMOS process and the power consumption and the chip area can be reduced as well.

The integrated circuit 1602 can be fabricated using the high integration process, such as the analog CMOS process or the BiCMOS process, suitable for the analog circuit. The CMOS process or the bipolar process optimized for analog fabrication is superior to the digital CMOS process specialized for microfabrication in terms of the high power characteristics, such as the withstanding voltage, and the resulting circuit can process the analog signal with the large amplitude as shown in the first embodiment. The bipolar process has the excellent high-frequency characteristics, allowing the frequency conversion circuits 214 and 217 to up-convert or down-convert the modulating signal into the GHz band. Moreover, since it is possible to incorporate the logic circuit, Phase Locked Loop (PLL) can be integrated to integrate the stable signal source.

Since the integrated circuit 1603 integrates the block required to satisfy the high-frequency characteristics and the high power characteristics altogether, it is generally difficult to be achieved using the analog CMOS process or the bipolar process. However, by configuring the integrated circuit of the compound semiconductor, such as GaAs, the transistor can be achieved with the cut-off frequency or the maximum oscillating frequency over 100 GHz and a certain amount of withstanding voltage. Thus, it is possible to achieve the high-frequency power amplifier or the DC converter requiring the high-frequency characteristics as well as the withstanding voltage or the high power characteristics. Here, while the feedback circuit 216 is not necessarily integrated, it can be fabricated by patterning on a printed board where these integrated circuits are mounted.

Seventh Embodiment

The seventh embodiment of the present invention will be described by reference to the drawings.

Figure 17:
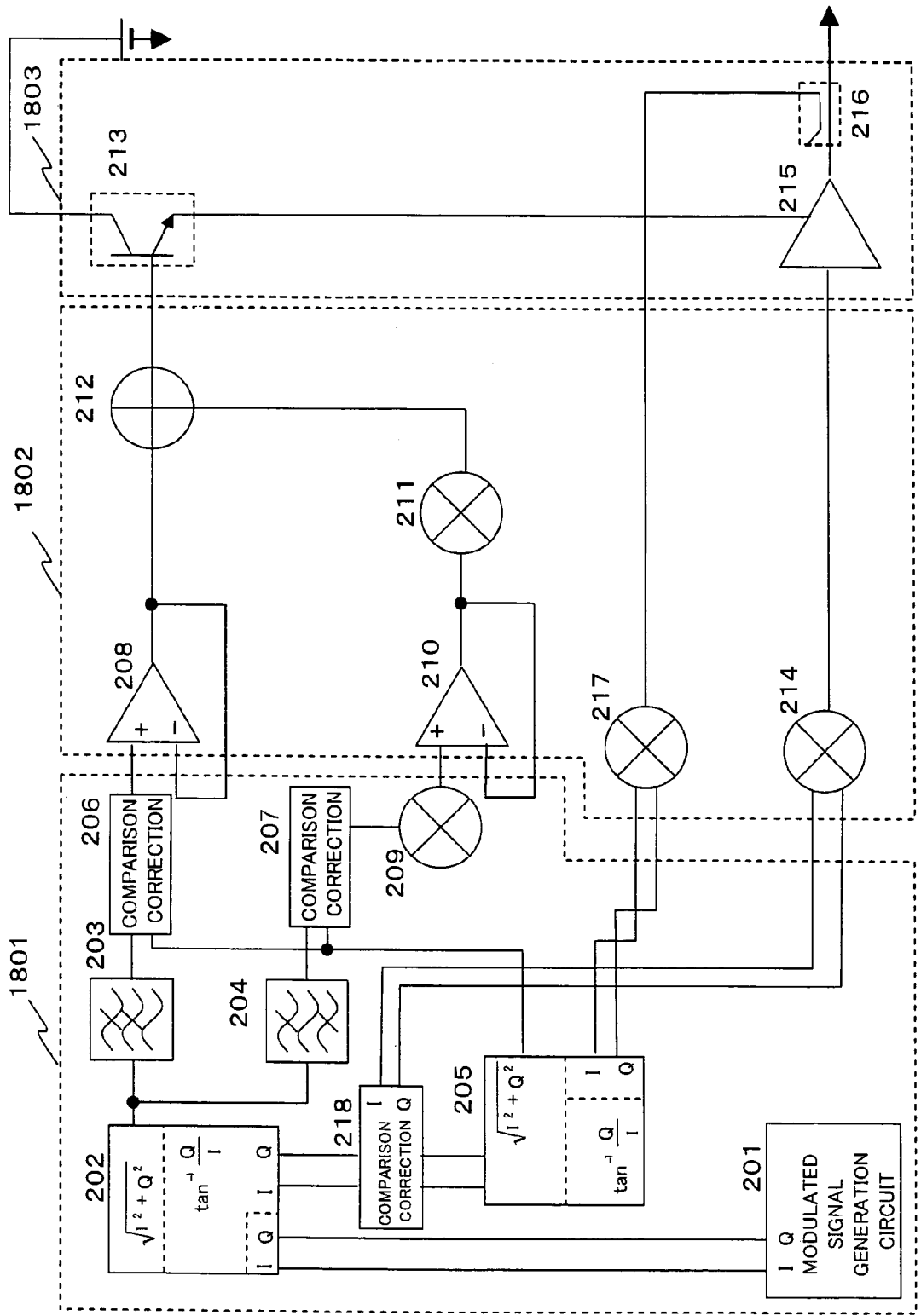
FIG. 17 is a block circuit diagram of a seventh embodiment (where the fifth embodiment is integrated)
Figure 18:
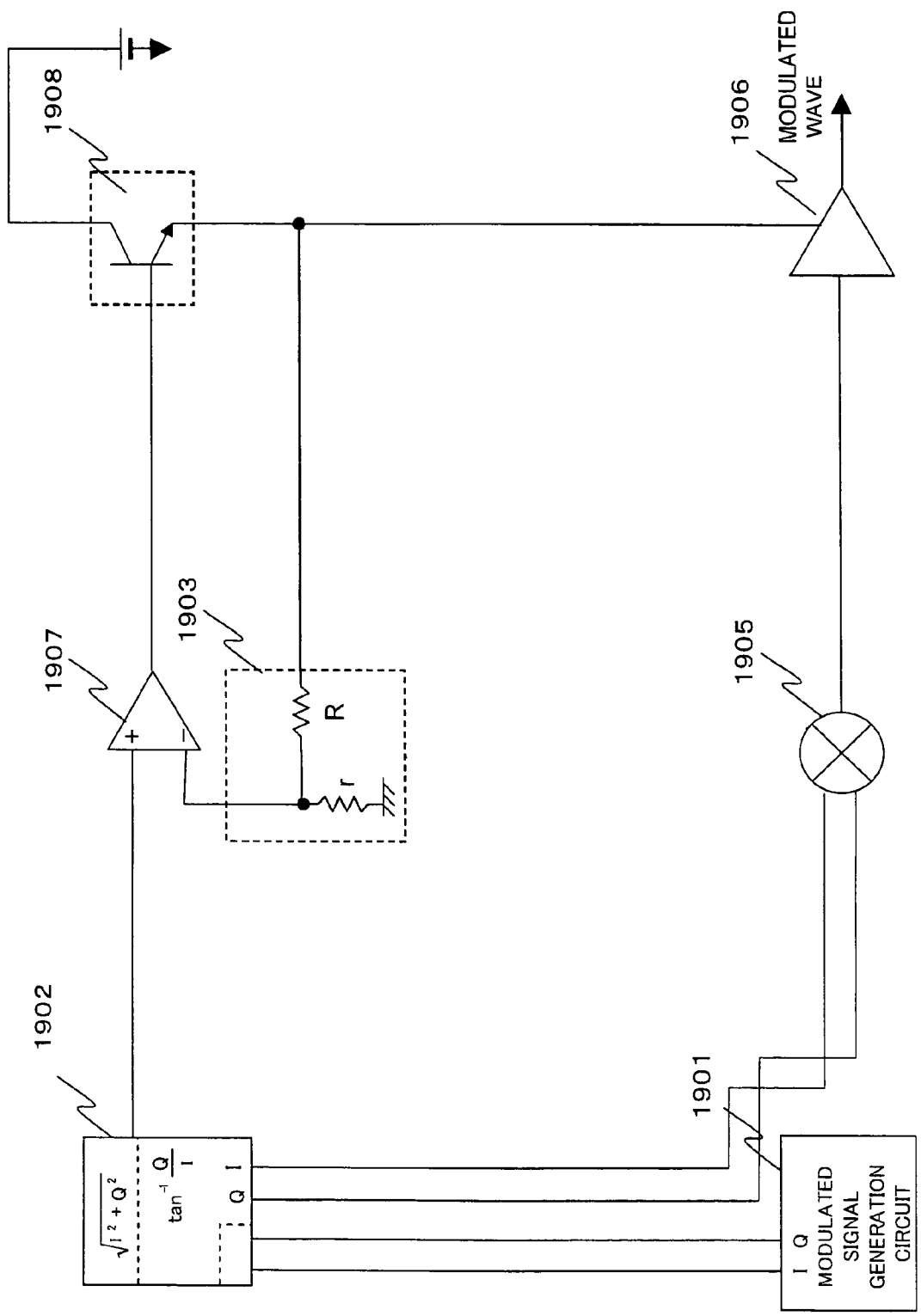
FIG. 18 is a block circuit diagram schematically illustrating a conventionally known EER method.

FIG. 17 shows a configuration of this embodiment.

The seventh embodiment shows the configuration which, in the case that the configuration of the fifth embodiment is implemented using the integrated circuits, should be included in the integrated circuits. What is different from the sixth embodiment is that the comparison correction circuit 218 is added to the integrated circuit 1801. The effect to be obtained is similar to that of the sixth embodiment, so that the description thereof will be omitted here. The integrated circuits 1802 and 1803 are identical to the integrated circuits 1602 and 1603.

INDUSTRIAL APPLICABILITY

The transmitter circuit according to the present invention can be utilized as a transmitter section of a wireless communication device such as a mobile phone or a wireless LAN.

What is claimed is:

1. A transmission method of detecting an amplitude component from a modulating signal containing a phase component and said amplitude component, direct-current converting said amplitude component and frequency-converting said modulating signal to high frequency, generating a modulated wave by multiplying said direct-current converted amplitude component by said frequency-converted modulating signal, and correcting by feedback processing, a level of said amplitude component to be direct-current converted, the transmission method comprising the steps of:

dividing said amplitude component to be direct-current converted into multiple frequency bands;

performing a feedback process not involving frequency conversion for said amplitude component, wherein frequency thereof is selected to fall within at least one first frequency band among said multiple frequency bands;

performing a feedback process involving frequency conversion and frequency inversion for said amplitude component, wherein frequency thereof is selected to fall within at least one second frequency band among said multiple frequency bands; and after mutually adding said amplitude components within all of said frequency bands after said feedback process, direct-current converting an added result.

2. The transmission method according to claim 1, wherein said feedback process is operated for said direct-current converted amplitude component.

3. The transmission method according to claim 1, wherein said feedback process is operated for said amplitude components contained in said modulated wave.

4. A transmitter circuit comprising:

modulating signal generating means for generating a modulating signal containing a phase component and an amplitude component;

modulating signal detecting means for detecting at least said amplitude component of said modulating signal generated by said modulating signal generating means;

direct-current conversion means for outputting said amplitude component detected by said modulating signal detecting means after direct-current conversion;

first frequency conversion means for frequency-converting said modulating signal output from said modulating signal generating means to output a modulated wave;

a high-frequency power amplifier for inputting said modulated wave output from said first frequency conversion means and said amplitude component output from said direct-current conversion means to amplify said modulated wave, wherein an output section thereof multiplies said modulated wave by said amplitude component to output, wherein:

said circuit comprises modulating signal band dividing means for dividing at least said amplitude component generated by said modulating signal generating means into multiple frequency bands; and said modulating signal band dividing means is comprised of at least one first modulating signal band dividing means and at least one second modulating signal band dividing means, wherein:

said first modulating signal band dividing means is configured by:

at least one first frequency selecting means for frequency-selecting at least said amplitude component generated by said modulating signal detecting means;

at least one second frequency selecting means for frequency-selecting said amplitude component direct-current converted by said direct-current conversion means within the same frequency band with said first frequency selecting means;

first feedback means for feeding back said amplitude component frequency-selected by said second frequency selecting means with a certain feedback amount; and first amplification means for inputting said amplitude components from said first frequency selecting means and from said first feedback means, and for amplifying said amplitude component from said first frequency selecting means, wherein:

said second modulating signal band dividing means is configured by:

at least one third frequency selecting means for frequency-selecting at least said amplitude component generated by said modulating signal detecting means;

at least one second frequency converting means for frequency-converting said amplitude component frequency-selected by said third frequency selecting means;

at least one fourth frequency selecting means for frequency-selecting said amplitude component direct-current converted by said direct-current conversion means within the same frequency band with said third frequency selecting means;

third frequency conversion means for frequency-converting said amplitude component frequency-selected by said fourth frequency selecting means similarly with said second frequency conversion means;

second feedback means for feeding back said amplitude component frequency-converted by said third frequency conversion means with a certain feedback amount;

second amplification means for inputting said amplitude components from said second frequency conversion means and from said second feedback means, and for amplifying said amplitude component from said second frequency conversion means; and fourth frequency conversion means for frequency-converting said amplitude component from said second amplification means inversely with said second frequency conversion means, and wherein said circuit further comprises:

adding means for adding up said amplitude component from said first modulating signal band dividing means with said amplitude component from said second modulating signal band dividing means, and for outputting an added signal to said direct-current conversion means.

5. The transmitter circuit according to claim 4, wherein said modulating signal detecting means also detects a phase component of said modulating signal, and said modulating signal input into said first frequency conversion means is said phase component from said modulating signal detecting means.

6. The transmitter circuit according to claim 4, wherein said second frequency conversion means converts said frequency band of said amplitude component from said third frequency selecting means to the same frequency band with said amplitude component from said first frequency selecting means.

7. The transmitter circuit according to claim 4, wherein said modulating signal generating means, said modulating signal detecting means, said first and third frequency selecting means, and said second frequency conversion means are integrated as a first integrated circuit, said first and second amplification means, said adding means, said second and fourth frequency selecting means, said first, third and fourth frequency conversion means, and said first and second feedback means are integrated as a second integrated circuit, and said high-frequency power amplifier and said direct-current conversion means are integrated as a third integrated circuit.

8. A transmitter circuit, comprising:

modulating signal generating means for generating a modulating signal containing a phase component and an amplitude component;

first modulating signal detecting means for detecting at least said amplitude component of said modulating signal generated by said modulating signal generating means;

first frequency selecting means for frequency-selecting at least said amplitude component detected by said first modulating signal detecting means;

second frequency selecting means for selecting frequency different from the frequency selected by said first frequency selecting means of at least said amplitude component detected by said first modulating signal detecting means;

direct-current conversion means;

first frequency conversion means for frequency-converting said modulating signal output from said modulating signal generating means;

a high-frequency power amplifier for inputting a modulated wave output from said first frequency conversion means and an amplitude signal from said direct-current conversion means to amplify said modulated wave, wherein an output section thereof multiplies said modulated wave by said amplitude component to output;

feedback means for feeding back output power from said high-frequency power amplifier;

second frequency conversion means for frequency-converting said output power from said feedback means inversely with said first frequency conversion means;

second modulating signal detecting means for detecting at least said amplitude component of an output signal from said second frequency conversion means;

first comparison correction means for comparing two signals from said second modulating signal detecting means and said first frequency selecting means to generate an amplitude signal corrected based on a comparison result;

second comparison correction means for comparing two signals from said second modulating signal detecting means and said second frequency selecting means to generate an amplitude signal corrected based on a comparison result;

first amplification means for amplifying said amplitude signal from said first comparison correction means;

third frequency conversion means for frequency-converting said amplitude signal from said second comparison correction means;

second amplification means for amplifying said amplitude signal from said third frequency conversion means;

fourth frequency conversion means for frequency-converting said amplitude signal output from said second amplification means inversely with said third frequency conversion means; and adding means for adding up said amplitude signal output from said first amplification means with said amplitude signal output from said fourth frequency conversion means to output to said direct-current conversion means.

9. The transmitter circuit according to claim 8, wherein said first and second modulating signal detecting means also detect a phase component of said modulating signal, said circuit further comprises third comparison correction means for comparing a signal including an amplitude phase from said first modulating signal detecting means with a signal including an amplitude phase from said second modulating signal detecting means to generate a phase signal corrected based on a comparison result, and an input signal of said first frequency conversion means is a phase component output from said third comparison correction means.

10. The transmitter circuit according to claim 8, wherein said third frequency conversion means converts a frequency band of said amplitude signal from said second comparison correction means to the same frequency band with said amplitude signal from said first comparison correction means.

11. The transmitter circuit according to claim 8, wherein, said modulating signal generating means, said first and second modulating signal detecting means, said first and second comparison correction means, said first and second frequency selecting means, and said third frequency conversion means are integrated as a first integrated circuit, said first and second amplification means, said adding means, and said first, second and fourth frequency conversion means are integrated as a second integrated circuit, and said high-frequency power amplifier, said feedback means, and said direct-current conversion means are integrated as a third integrated circuit.

12. The transmitter circuit according to claim 10, wherein said second integrated circuit includes said third comparison correction means integrated therewith.

* * * * *